United States Patent
Katayama et al.

(10) Patent No.: US 7,379,152 B2
(45) Date of Patent: May 27, 2008

(54) EXPOSURE APPARATUS AND EXPOSURE METHOD

(75) Inventors: Toru Katayama, Kanagawa (JP);
Daisuke Nakaya, Kanagawa (JP);
Naozumi Jogo, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 245 days.

(21) Appl. No.: 11/091,522

(22) Filed: Mar. 29, 2005

(65) Prior Publication Data

US 2005/0213064 A1    Sep. 29, 2005

(30) Foreign Application Priority Data

Mar. 29, 2004   (JP)  ............... 2004-096565

(51) Int. Cl.
*G03B 27/68* (2006.01)
*G03B 27/00* (2006.01)
*G03B 27/42* (2006.01)

(52) U.S. Cl. .............. 355/52; 355/18; 355/53
(58) Field of Classification Search .......... 355/52, 355/18, 55, 59, 62; 382/289, 101, 141; 347/129; 356/399, 400, 401
See application file for complete search history.

(56) References Cited

U.S. PATENT DOCUMENTS

2004/0008332 A1*   1/2004   Nakaya et al. ............... 355/53
2004/0126004 A1*   7/2004   Kikuchi ..................... 382/141

FOREIGN PATENT DOCUMENTS

| JP | 2000-321025 A | 11/2000 |
| JP | 2003-272989 | 9/2003 |
| KR | 2003-0074291 | 9/2003 |

* cited by examiner

*Primary Examiner*—Peter B. Kim
(74) *Attorney, Agent, or Firm*—Sughrue Mion, PLLC

(57) ABSTRACT

An exposure apparatus and method in which an image is formed on a recording medium mounted on a recording stage by irradiating a light beam based on image data from a recording head while the recording head and the recording stage are relatively moved, in the exposure apparatus and method, storing in advance, in a storage section, shift-amount data of a detected displacement of an image-form position with respect to a stage surface of the recording stage in a direction intersecting a direction in which the recording stage moves, which displacement occurs accompanied by movement of the recording stage; carrying out shifting for each of pixels of an image formed by the image data based on the shift-amount data stored in the storage section; and controlling exposure for the recording medium based on image data of the shifted image, is provided to reduce distortion of the image.

29 Claims, 24 Drawing Sheets

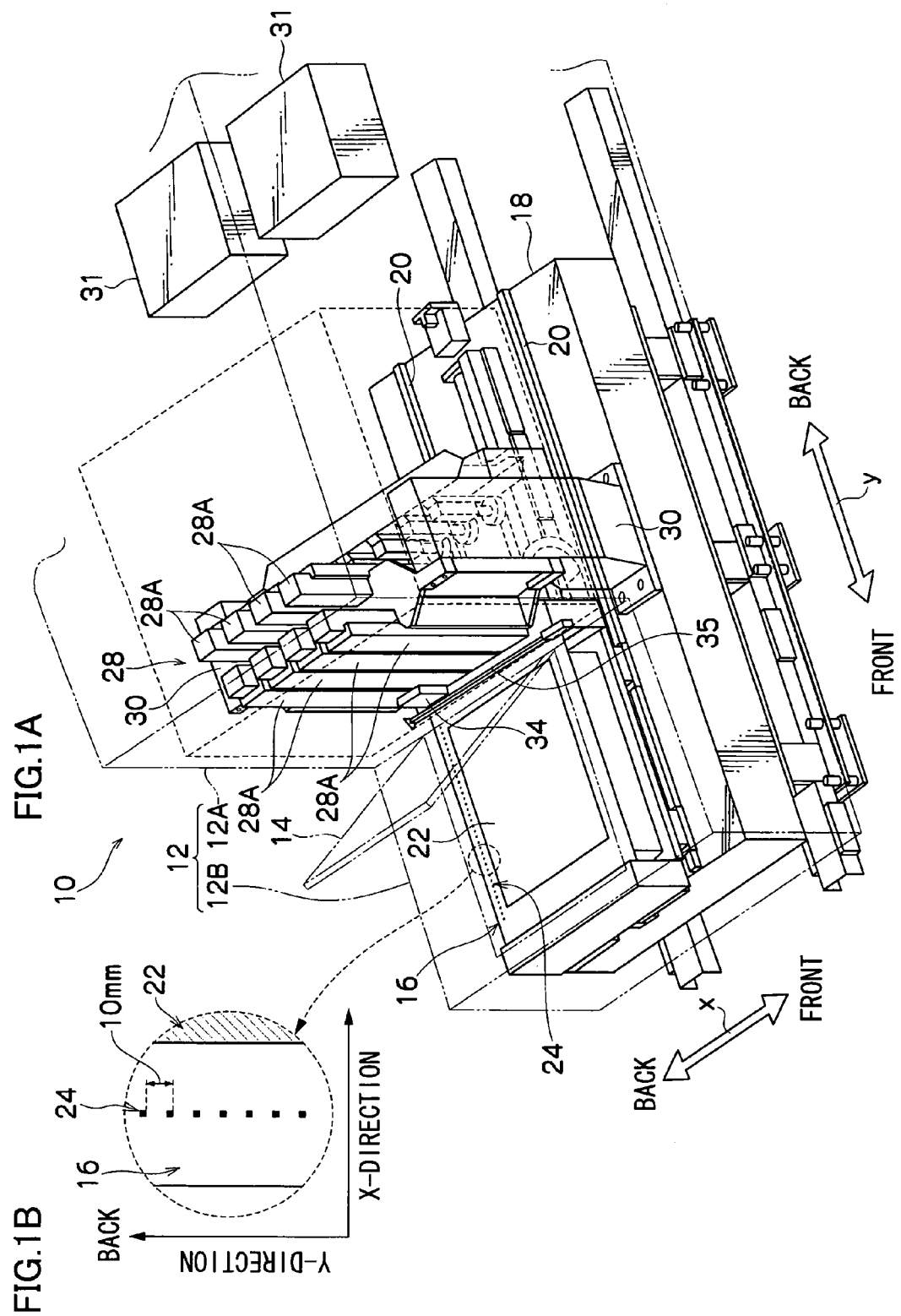

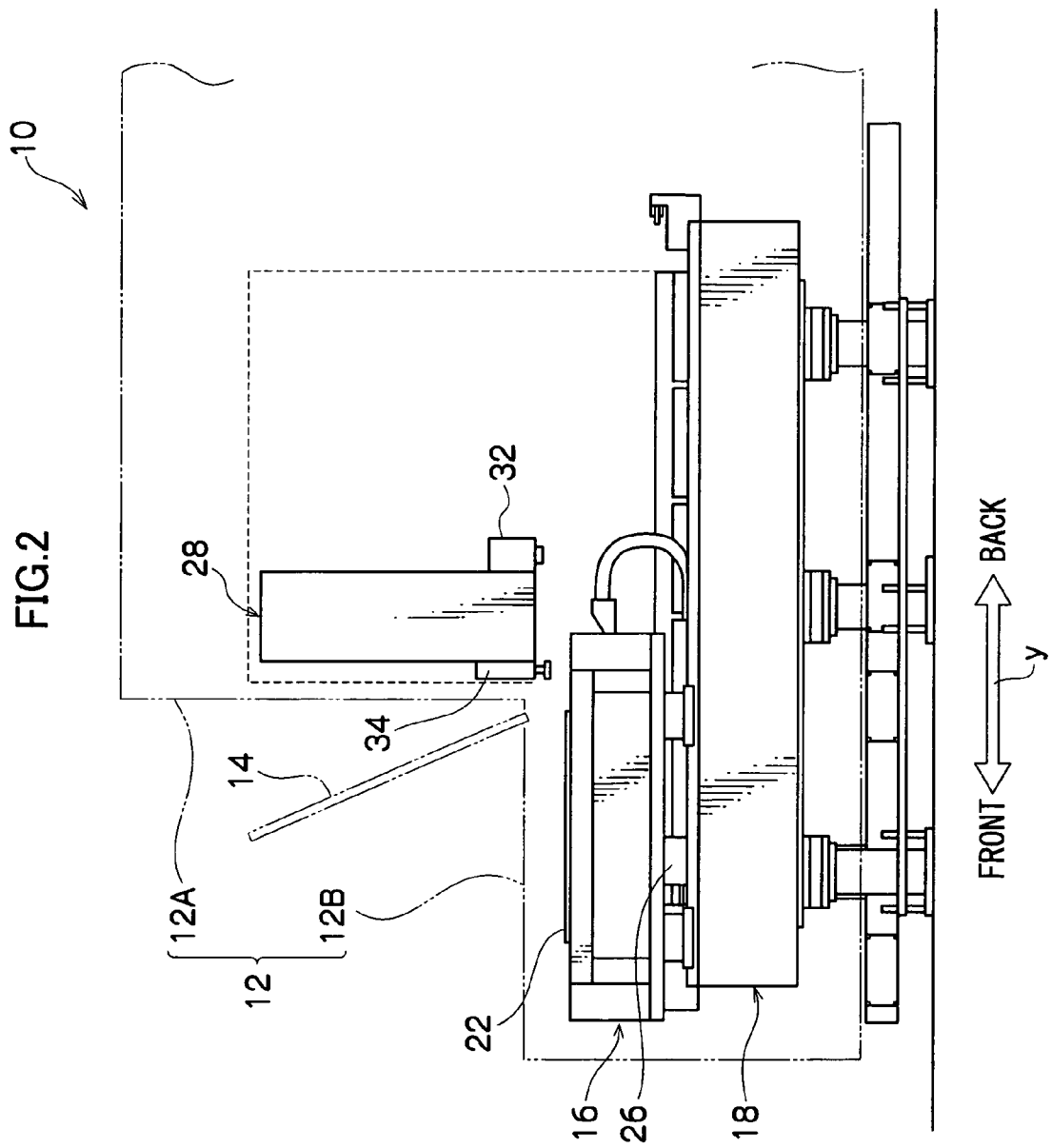

SCANNING DIRECTION

INPUT IMAGE DATA

DIVISION PROCESSING

IMAGE DATA OF EACH HEAD ASSEMBLY 28A

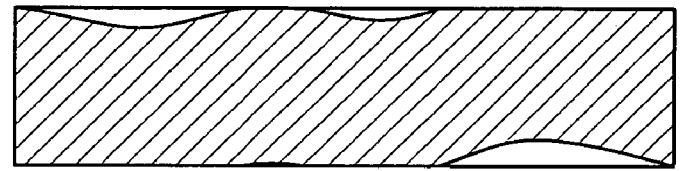
FIG.10D TRIMMING AT CONNECTING-LINE POSITIONS
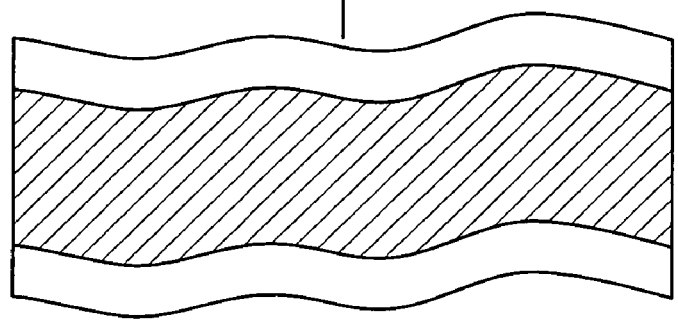
FIG.10C SHIFTING OF ENTIRE IMAGE
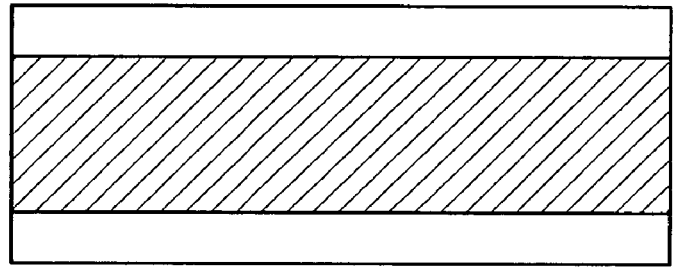
FIG.10B MERGING OF IMAGE REGIONS AT BOTH ENDS
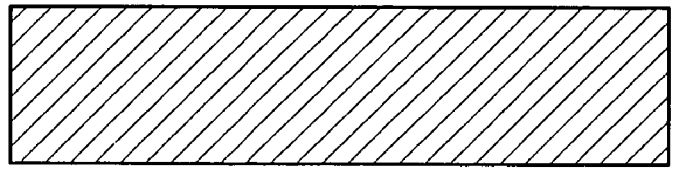
FIG.10A ORIGINAL IMAGE DATA TO BE DEPICTED BY HEAD ASSEMBLY 28A

ARRANGEMENT OF EXPOSURE HEADS (FROM ABOVE)

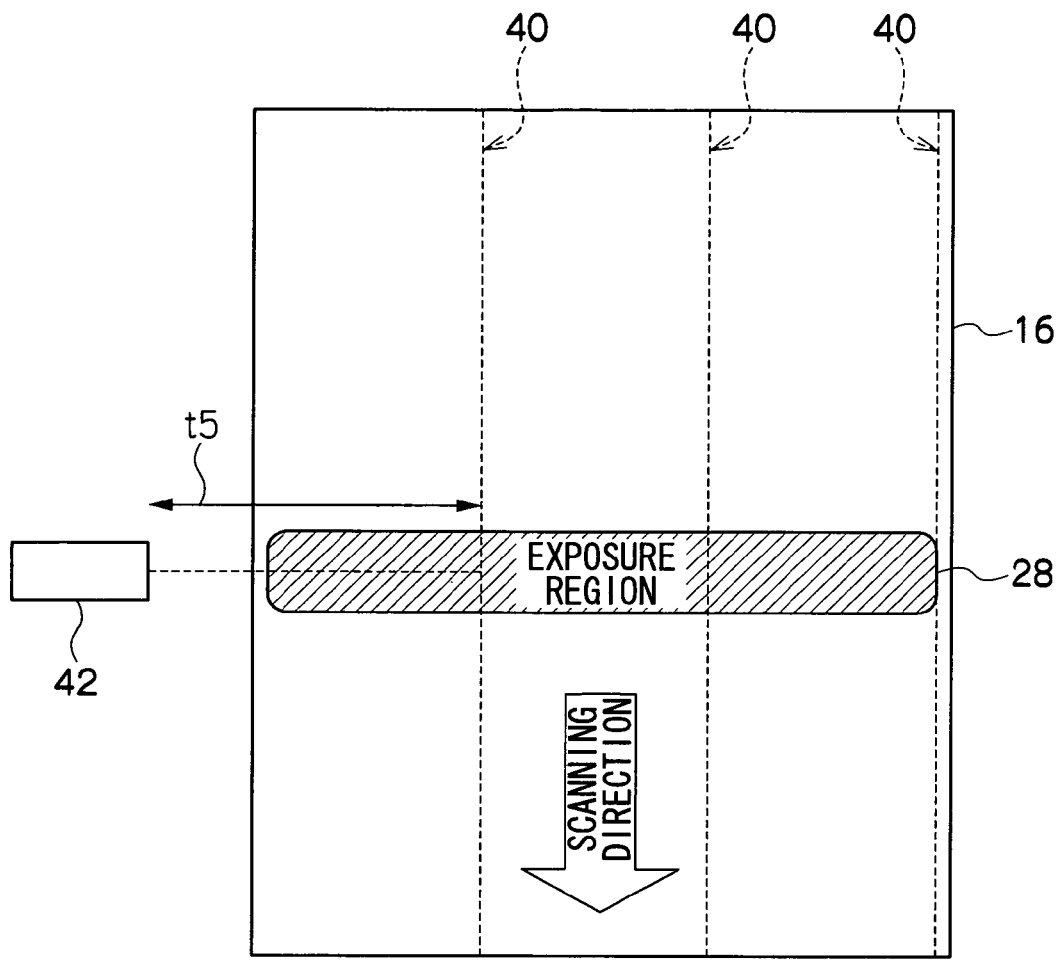
DATA ACQUISITION BY MEASURING MACHINE
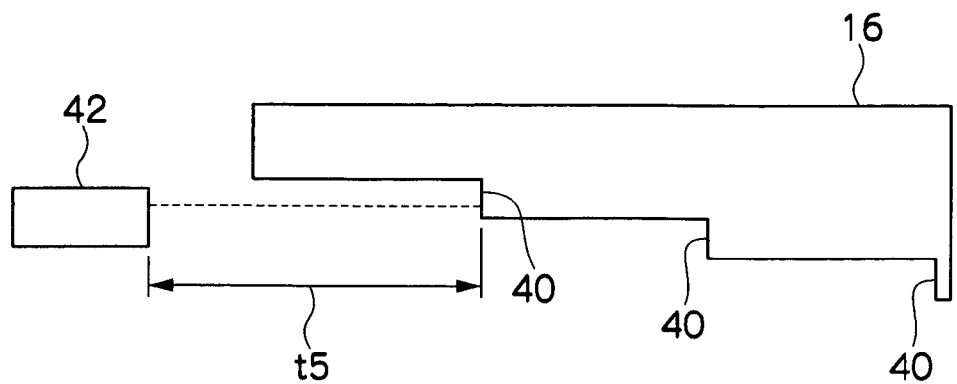

PATTERN FOR ACQUISITION
OF POSITION DATA

STATE IN WHICH IMAGE IS
DEPICTED ON RECORDING MEDIUM

FIG.21

| MOVING DISTANCE [mm] | SHIFT AMOUNT IN MOVING DIRECTION [μm] |
|---|---|
| 0 to 50 | 4.5 |
| 50 to 100 | 1.0 |
| 100 to 150 | -6.5 |
| 150 to 200 | -14.5 |

IMAGE TO BE FORMED BY IMAGE DATA → MODIFIED IMAGE

IMAGE TO BE FORMED BY IMAGE DATA → MODIFIED IMAGE

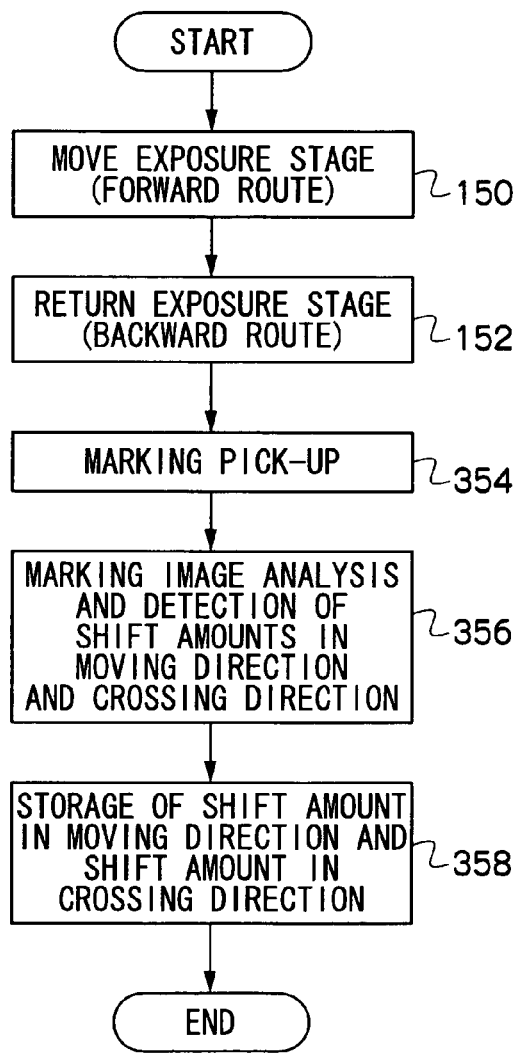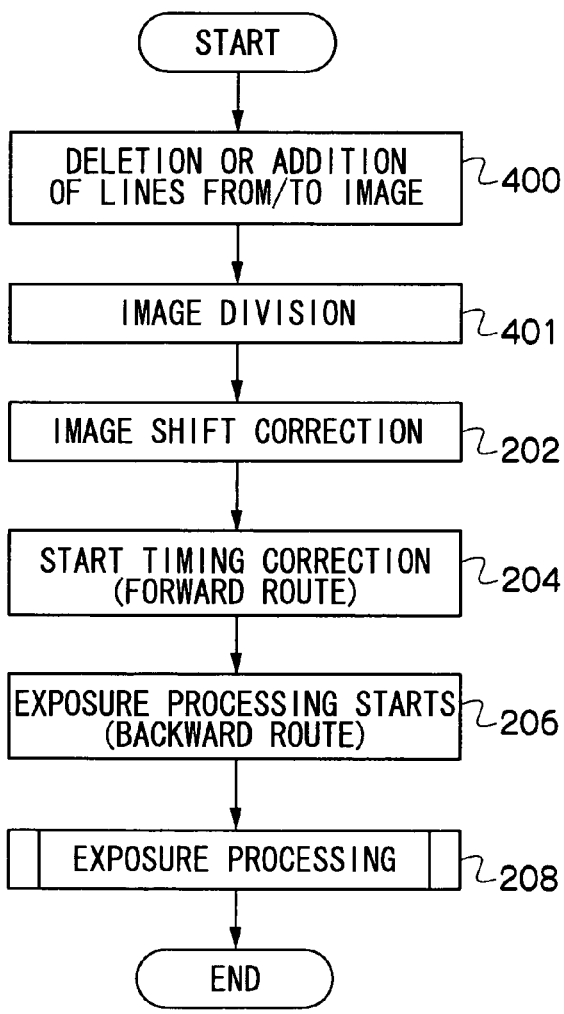

EXPOSURE APPARATUS AND EXPOSURE METHOD

CROSS-REFERENCE TO RELATED APPLICATION

This application claims priority under 35 USC 119 from Japanese Patent Application No. 2004-096565, the disclosure of which is incorporated by reference herein.

BACKGROUND OF THE INVENTION

1. Field of the Invention

The present invention relates to an exposure apparatus that corrects distortion of an image caused by zigzag movement of a recording stage, which zigzag movement occurs due to movement of the recording stage in exposure processing.

2. Description of the Related Art

Conventionally, as an apparatus in which a predetermined pattern is recorded on a substrate of a recording medium, for example, a printed wiring board (hereinafter referred to as "PWB") or a flat panel display (hereinafter referred to as "FPD"), a surface exposure apparatus using a mask has been widely used.

However, the fineness of a pattern to be recorded on PWB or FPD (a wiring pattern) becomes higher accompanied by high density packaging of parts, and a problem about displacement of a recording position caused along with expansion and contraction of a mask has become apparent. For example, when a multi-layer printed wiring board is used, alignment of a hole such as a through hole formed on a substrate, and a pattern on each of the layers cannot be carried out with a high degree of accuracy. Accordingly, a problem arises that the fineness of a pattern cannot be made higher.

As a technique provided to solve these problems, there has been known a laser-scanning exposure apparatus in which a pattern is recorded directly on a recording medium, without using a mask, by irradiating a light beam from a recording head. In this laser-scanning exposure apparatus, a pattern can be drawn on a recording medium by carrying out exposure in which light beams are irradiated from multiple recording heads, which are linearly arranged, while moving a recording stage with a recording medium placed thereon.

However, in the aforementioned conventional laser-scanning exposure apparatus, when the recording stage is moved for drawing a pattern on a recording medium, this movement causes zigzag movement of the recording stage and displacement occurs on the recording stage. As a result, there is a problem that distortion is caused in the pattern drawn on the recording medium. The zigzag movement mentioned herein means displacement on the surface of the recording stage in a direction intersecting a direction in which the recording stage moves, which displacement is caused by movement of the recording stage. Due to movement of the recording stage, the surface of the recording stage is displaced in the intersecting direction, and therefore, a position at which a light beam is irradiated from a recording head to the recording medium would be displaced. This zigzag movement has a high reproducibility based on movement of the recording stage, and therefore, it is possible to prepare in advance shift-amount data regarding displacement of the recording stage.

Accordingly, Japanese Patent Application Laid-Open (JP-A) No. 2000-321025 discloses a laser-scanning exposure apparatus in which shift-amount data is prepared in advance by recording the moving behavior of the recording stage using two cameras provided at both sides of the recording stage, and at the time of drawing a pattern on a recording medium, the moving behavior of the recording stage is corrected based on the previously prepared shift-amount data, a light beam is irradiated on the recording medium, thereby allowing a pattern to be drawn thereon.

However, when the recording stage is moved, zigzag movement, which varies delicately at different positions, occurs on the recording stage due to yawing movement (i.e., the behavior of the recording stage in a direction in which it is moved). To this end, a correction amount for correcting zigzag movement varies slightly at respective positions of the recording heads. Accordingly, in order to achieve pattern drawing more precisely, it is necessary to carry out correction by recording the behavior of the recording stage at a greater number of positions and obtaining an amount of displacement at the position of each recording head. However, if the number of cameras used for recording the behavior increases, the manufacturing cost increases.

SUMMARY OF THE INVENTION

In view of the aforementioned circumstances, the present invention provides an exposure apparatus and method that can reduce distortion of an image to be drawn (formed) on a recording medium by detecting zigzag movement caused by movement of a recording stage, for each of positions of recording heads.

A first aspect of the present invention is an exposure apparatus in which an image is formed on a recording medium mounted on a recording stage by irradiating a light beam based on image data from a recording head while the recording head and the recording stage are relatively moved, to allow the image to be formed by exposure on the recording medium, the apparatus comprising: a displacement detecting section that detects displacement of an image-form position with respect to a stage surface of the recording stage in a direction intersecting a direction in which the recording stage moves, which displacement occurs accompanied by movement of the recording stage; a storage section that stores therein shift-amount data of the displacement detected by the displacement detecting section; a shift section that shifts respective pixels of an image formed by the image data based on the shift-amount data stored in the storage section; and an exposure control section that, based on image data of the image shifted by the shift section, controls exposure for the recording medium.

According to the first aspect, when the recording medium is mounted on the recording stage and the recording stage moves relatively to the recording head, a light beam based on image data is irradiated from the recording head, and an image is formed by exposure on the recording medium.

At this time, displacement in a direction intersecting a direction in which the recording stage moves with respect to a stage surface of the recording stage, which displacement is caused by zigzag movement, occurs on the recording stage accompanied by movement thereof. Therefore, the displacement detecting section detects displacement caused by the zigzag movement and stores shift-amount data of displacement in the storage section. The shift section, based on the shift-amount data of displacement stored in the storage section, shift respective pixels of an image to be formed by image data, and correct displacement of the recording stage caused by the zigzag movement. In the exposure control section, exposure for the recording medium is controlled based on the image data of the shifted image, and displacement of the recording stage caused by zigzag movement is corrected. And, accordingly, distortion of an image to be drawn is corrected.

In this manner, distortion of an image to be drawn can be corrected, and therefore, an image to be drawn on the recording medium can be recorded finely. Further, image shift is carried out based on the shift-amount data stored in the storage section, and therefore, a process load in the exposure processing is reduced.

A second aspect of the invention is an exposure apparatus in which an image is formed on a recording medium mounted on a recording stage by irradiating light beams based on image data from plural recording heads arranged linearly while the recording heads and the recording stage are relatively moved in a direction intersecting a direction in which the recording heads are arranged, to allow the image to be formed by exposure on the recording medium, the apparatus comprising: a displacement detecting section that detects displacement of an image-form position with respect to a stage surface of the recording stage in a direction intersecting a direction in which the recording stage moves, which displacement occurs accompanied by movement of the recording stage; a storage section that stores therein shift-amount data of the displacement detected by the displacement detecting section; a dividing section that divides an image formed by the image data into separate images to be respectively formed by the plural recording heads; a shift section that, based on the shift-amount data stored in the storage section, shifts respective pixels of each of the separate images obtained by the dividing section; a trimming section that trims the separate images shifted by the shift section at positions at which the separate images are connected; and an exposure control section that, based on respective image data of the separate images subjected to trimming by the trimming section, controls exposure for the recording medium by the recording heads.

According to the second aspect, when the recording medium is mounted on the recording stage, and the recording heads and the recording medium are moved relatively in a direction intersecting a direction in which the recording heads are arranged linearly, light beams are irradiated from the plural recording heads arranged linearly based on respective image data, and an image is formed by exposure on the recording medium.

At this time, displacement in a direction intersecting a direction in which the recording stage moves with respect to a stage surface of the recording stage, which displacement is caused by zigzag movement, occurs on the recording stage accompanied by movement thereof. Therefore, the displacement detecting section detects displacement caused by the zigzag movement, and stores shift-amount data of displacement in the storage section. Further, in the image dividing section, in order that, with using image data, the image is formed by exposure on the recording medium from the respective recording heads arranged linearly, the image formed by the image data is divided into separate images to be exposed by the respective recording heads. The shift section shifts each separate image based on shift-amount data stored in the storage section, and correct displacement caused by the zigzag movement. In the trimming section, in order that these separate images are exposed by the respective recording heads, each separate image is subjected to trimming at a connecting-line position. The exposure control section, based on respective image data of the separate images having been subjected to trimming, controls exposure for the recording medium.

In this manner, even when an image is recorded by plural recording heads, distortion of an image to be drawn can be corrected by dividing image data into respective images of the recording heads and carrying out image shift for each of separate images. Accordingly, an image to be drawn on a recording image can be recorded finely.

In a third aspect of the invention, the dividing section divides the image formed by the image data into images which can be exposed by the respective recording heads, and thereafter, to each image into which the image formed by the image data is divided by the dividing section, an image region of the adjacent image into which the image formed by the image data is divided by the dividing section is added, the image region having at least a width of a shift amount based on the shift-amount data stored in the storage section.

According to the third aspect, the dividing section divides an image formed by image data into images which can be exposed by the recording heads, and to each image into which the image formed by the image data is divided by the dividing section, an image region of the adjacent image into which the image formed by the image data is divided by the dividing section is added, the image region having at least a width of a shift amount. As a result, although the shift section shifts each separate image by the shift amount, the recording heads allows exposure of an image.

In a fourth aspect of the invention, the dividing section divides the image formed by the image data into images which can be exposed by the respective recording heads, such that to each image into which the image formed by the image data is divided by the dividing section, an image region of an adjacent image into which the image formed by the image data is divided by the dividing section is added before dividing, the image region having at least a width of a shift amount based on the shift-amount data stored in the storage section.

According to the fourth aspect, the dividing section divides the image formed by the image data into images which can be exposed by the respective recording heads, such that to each image into which the image formed by the image data is divided by the dividing section, an image region of an adjacent image into which the image formed by the image data is divided by the dividing section is added, the image region having at least a width of a shift amount. As a result, it becomes unnecessary to carry out adding (merging) as separate processing.

In a fifth aspect of the invention, one row or plural rows of markings are arranged on the recording stage at fixed intervals along a direction in which the recording head and the recording stage are moved, and wherein the displacement detecting section comprises: at least one image-picking up section that image-picks up the markings of the row on the recording stage at each predetermined timing; a moving section that moves the image-picking up section in the direction intersecting the direction in which the recording head and the recording stage relatively move, thereby allowing image-picking up of each row of markings; an identical relative position detecting section that detects an identical relative position of each of the markings from the marking image image-picked up by the image-picking up section; and a first detecting section that, based on a position, in the marking image, of the identical relative position of each of the markings detected by the identical relative position detecting section, detects displacement in the intersecting direction.

According to the fifth aspect, one row or plural rows of markings are arranged on the recording stage at fixed intervals along a direction in which the recording head and the recording stage are moved. The image-picking up section is provided so as to image pick up the markings on the row at each predetermined timing. Further, the image-picking up section can be moved by the moving section in a direction intersecting the direction in which the recording head and the recording stage are moved, and therefore, each row of markings can be image-picked up. Moreover, the identical relative position detecting section is provided so as to detect an identical relative position of each marking from a marking image image-picked up by the image-picking up section. The identical relative position mentioned herein means positions in markings which relatively coincide with each other (for example, center-of-gravity positions of markings). At this time, the markings are provided along the direction in which the recording head and the recording stage move, and therefore, the first detecting section can detect displacement caused by zigzag movement of the recording stage from the position within the marking image of the identical relative position of each marking.

In this manner, it is possible to detect displacement caused by zigzag movement of the recording stage by image-picking up the markings on the recording stage at each predetermined timing. Further, since displacement can be detected by image-picking up plural rows of markings even with one image-picking up section, an increase in the manufacturing cost of the exposure apparatus can be restrained.

In a sixth aspect of the invention, one or plural length-measuring portions are provided on the recording stage, and wherein the displacement detecting section comprises: a laser length-measuring machine that is disposed in a direction intersecting a direction in which the recording head and the recording stage relatively move with respect to the stage surface of the recording stage, and measures a distance to the length-measuring portion of the recording stage at each predetermined timing; and a second detecting section that, based on variations in the distance to the length-measuring portion of the recording stage, which distance is measured by the laser length-measuring machine, detects displacement in the intersecting direction.

According to the sixth aspect, the laser length-measuring machine is disposed in a direction intersecting the direction in which the recording head and the recording stage move relatively, with respect to the stage surface, and can measure a distance the length-measuring portions of the recording stage therebetween at each predetermined timing. At this time, when no displacement caused by zigzag movement occurs on the recording stage, the recording stage moves straight in the direction in which it moves, and therefore, the distance to the length-measuring portion, which is measured by the laser length-measuring means disposed in the direction intersecting the stage moving direction, becomes fixed. Accordingly, the second detecting section can detect displacement of the recording stage from the variations in the distance to the length-measuring portions, which distance is measured by the laser length-measuring machine at each predetermined timing.

In this manner, displacement caused by zigzag movement of the recording stage can be detected by measuring the distance by the laser length-measuring machine at a predetermined timing.

In a seventh aspect of the invention, the displacement detecting section comprises: a position pattern exposure section that forms by exposure a predetermined position-data-acquiring pattern on the recording medium; and a registration section that registers, in the storage section, the shift-amount data obtained from the position-data-acquiring pattern formed by exposure by the position pattern exposure section.

According to the seventh aspect, the position pattern exposure section carries out exposure for a predetermined position-data-acquiring pattern, and therefore, displacement can be obtained by measuring intervals of marking on the exposed pattern, or the like. The registration section can register the shift-amount data obtained from displacement in the storage section. Therefore, displacement caused by zigzag movement is corrected based on the shift-amount data stored in the storage section, thereby making it possible to reduce distortion of an image to be drawn on the recording medium.

In an eighth aspect of the invention, the markings are provided on the recording stage by mounting a marking chart on which markings are formed on the recording stage.

According to the eighth aspect, the markings can be provided on the recording stage by mounting a marking chart on which markings are formed on the recording stage. Therefore, the position of the markings can be appropriately altered. Further, when no marking is required, the marking chart can be removed.

In a ninth aspect of the invention, the displacement detecting section detects the displacement at each of positions corresponding to all the recording heads.

According to the ninth aspect, the displacement detecting section can detect an amount of displacement at plural positions. Therefore, by detecting the displacement at each of positions corresponding to all the recording heads, correction for the respective recording heads can be made most suitable.

A tenth aspect of the invention is an exposure apparatus in which an image is formed on a recording medium mounted on a recording stage by irradiating a light beam based on image data from a recording head while the recording head and the recording stage are relatively moved, to allow the image to be formed by exposure on the recording medium, the apparatus comprising: a displacement detecting section that detects displacement of an image-form position with respect to-a stage surface of the recording stage in a moving direction in which the recording stage moves and in an intersecting direction intersecting the moving direction, which displacement occurs accompanied by movement of the recording stage; a storage section that stores therein shift-amount data of displacement in the moving direction, and shift-amount data of displacement in the intersecting direction, which displacement is both detected by the displacement detecting section; a modification section that carries out modification so as to delete or add a line or lines extending along the intersecting direction, from or to an image formed by the image data based on the shift-amount data in the moving direction which is stored in the storage section; a shift section that shifts respective pixels of the image modified by the modification section, based on the shift-amount data in the intersecting direction which is stored in the storage section; and an exposure control section that, based on image data of the image shifted by the shift section, controls exposure for the recording medium.

According to the tenth aspect, when the recording medium is mounted on the recording stage and the recording stage is moved relative to the recording head, a light beam based on image data is irradiated from the recording head and an image is formed by exposure on the recording medium.

At this time, there are cases in which pitching vibration may occur in the recording stage together with zigzag movement accompanied by movement of the recording stage, and due to the pitching vibration, displacement may also occur in the moving direction of the recording stage, thereby causing a distortion in an image (a pattern) to be drawn on the recording medium. The pitching vibration mentioned herein means arc-shaped pendulum's oscillation in a direction perpendicular to the recording stage. As a result, the stage surface would be brought into a sloping state, and therefore, the optical length of a light beam irradiated from above the recording stage varies, and this variation causes displacement of scanning pitch on the stage surface. The pitching vibration occurs depending on the manufacturing accuracy of the exposure apparatus, and it is possible to prepare in advance data concerning displacement of the recording stage as well as zigzag movement thereof because of high reproducibility accompanied by the movement of the recording stage.

To this end, the displacement detecting section detects displacement in the direction in which the recording stage moves and displacement of the recording stage in the direction intersecting the moving direction, with respect to the stage surface of the recording stage, and the storage section stores therein shift-amount data of displacement in the moving direction and shift-amount data of displacement in the intersecting direction. The modification section carries out modification so as to delete or add a line or lines extending along the intersecting direction of an image formed by image data, based on the shift-amount data in the moving direction stored in the storage section, and corrects displacement in the moving direction. The shift section shifts respective pixels of the modified image based on the shift-amount data in the intersecting direction which is stored in the storage section, and corrects displacement in the intersecting direction. The exposure control section controls, based on image data of an image in which displacement of the recording stage both in the moving direction and in the intersecting direction is corrected, exposure for the recording medium.

In this way, it is possible to correct an image to be drawn depending on displacement both in the moving direction and in the intersecting direction, which displacement is caused by movement of the recording stage. Therefore, a fine image can be formed on the recording medium.

An eleventh aspect of the invention is an exposure apparatus in which an image is formed on a recording medium mounted on a recording stage by irradiating light beams based on image data from plural recording heads arranged linearly while the recording heads and the recording stage are relatively moved in a direction intersecting a direction in which the recording heads are arranged, to allow the image to be formed by exposure on the recording medium, the apparatus comprising: a displacement detecting section that detects displacement of an image-form position with respect to a stage surface of the recording stage in a moving direction in which the recording stage moves and in an intersecting direction intersecting the moving direction, which displacement occurs accompanied by movement of the recording stage; a storage section that stores therein shift-amount data of displacement in the moving direction, and shift-amount data of displacement in the intersecting direction, which displacement is both detected by the displacement detecting section; a modification section that carries out modification so as to delete or add a line or lines extending along the intersecting direction, from or to an image formed by the image data based on the shift-amount data in the moving direction which is stored in the storage section; a dividing section that divides the image modified by the modification section into separate images to be respectively formed by the plural recording heads; a shift section that shifts respective pixels of the separate images, into which the image is divided by the dividing section, based on the shift-amount data in the intersecting direction which is stored in the storage section; a trimming section that trims the separate images shifted by the shift section at positions at which the separate images are connected; and an exposure control section that, based on respective image data of the separate images subjected to trimming by the trimming section, controls exposure for the recording medium by the recording heads.

According to the eleventh aspect, when the recording medium is mounted on the recording stage, and the recording heads and the recording medium are moved relatively to each other in a direction intersecting a direction in which the recording heads are linearly arranged, an image is formed by exposure on the recording medium in such a manner that light beams based on image data are irradiated from the plurality of recording heads linearly arranged.

At this time, there are cases in which pitching vibration may occur in the recording stage together with zigzag movement, accompanied by movement of the recording stage, and due to the pitching vibration, displacement may occur also in the moving direction of the recording stage. To this end, the displacement detecting section detects displacement in the direction in which the recording stage moves and displacement in the direction intersecting the moving direction, with respect to the stage surface of the recording stage. The storage section stores therein shift-amount data of the displacement of the recording stage in the moving direction, and shift-amount data of the displacement in the intersecting direction. The modification section carries out, based on the shift-amount data in the moving direction which is stored in the storage section, modification so as to delete or add a line or lines extending along the intersecting direction, from or to an image formed by image data, thus correcting displacement in the moving direction. The image dividing section divides the modified image into separate images to be exposure-formed by the plural recording heads because the image data is formed by exposure on the recording medium using a light beam from each of the recording heads arranged linearly. The shift section shifts each of the separate images based on the shift-amount data in the intersecting direction, which is stored in the storage section, and corrects displacement in the intersecting direction. The trimming section performs trimming at a position at which the separate images are connected because each of the separate images is subjected to exposure by each of the recording heads. The exposure control section controls, based on respective image data of the separate images subjected to trimming by the trimming section, exposure for the recording medium.

In this way, even when an image is recorded by the plurality of recording heads, an image to be formed by image data is corrected in accordance with displacement in the moving direction, the image is divided into separate images respectively for the recording heads, and image shifting is carried out for each separate image, thereby making it possible to correct distortion of an image to be drawn. Accordingly, a fine image can be formed on the recording medium.

In a twelfth aspect of the invention, the dividing section divides the image modified by the modification section into images which can be exposed by the respective recording heads, and thereafter to each image into which the modified image is divided by the dividing section, an image region of the adjacent image into which the modified image is divided by the dividing section is added, the image region having at least a width of a shift amount based on the shift-amount data stored in the storage section.

According to the twelfth aspect, the dividing section divides the image modified by the modification section into images which can be exposed by the respective recording heads, and to each image into which the modified image is divided by the dividing section, an image region of the adjacent image into which the modified image is divided by the dividing section is added, the image region having at least a width of a shift amount. As a result, even if each separate image is shifted by the shift section by the shift amount in the intersecting direction, the recording head allows exposure of an image.

In a thirteenth aspect of the invention, the dividing section divides the image modified by the modification section into images which can be exposed by the respective recording heads, such that to each image into which the modified image is divided by the dividing section, an image region of an adjacent image into which the modified image is divided by the dividing section is added before dividing, the image region having at least a width of a shift amount based on the shift-amount data stored in the storage section.

According to the thirteenth aspect, the dividing section divides the image modified by the modification section into images which can be exposed by the respective recording heads, such that to each image into which the modified image is divided by the dividing section, an image region of an adjacent image into which the modified image is divided by the dividing section is added, the image region having at least a width of a shift amount. As a result, it becomes unnecessary to carry out adding (merging) as an additional processing.

In a fourteenth aspect of the invention, one row or plural rows of markings are arranged on the recording stage at fixed intervals along a direction in which the recording head and the recording stage are moved, and wherein the displacement detecting section comprises: at least one image-picking up section that image-picks up the markings on the row on the recording stage at each predetermined timing; a moving section that moves the image-picking up section in the direction intersecting the direction in which the recording head and the recording stage relatively move, thereby allowing image-picking up of each row of markings; an identical relative position detecting section that detects an identical relative position of each of the markings from the marking image image-picked up by the image-picking up section; and a first detecting section that, based on a position, in the marking image, of the identical relative position of each of the markings detected by the identical relative position detecting section, detects displacement in the intersecting direction and in the moving direction of the recording stage.

According to the fourteenth aspect, one row or plural rows of markings are arranged on the recording stage at fixed intervals along a direction in which the recording head and the recording stage are moved. The image-picking up section images pick up the markings on the row or rows at each predetermined timing. Further, the image-picking up section can move by the moving section in a direction intersecting the direction in which the recording head and the recording stage moves, thus allowing image-picking up of the row or rows of markings. Moreover, the identical relative position detecting section detects an identical relative position of each of the markings from the marking image image-picked up by the image-picking up section. In this case, the markings are arranged along the direction in which the recording head and the recording stage move, and are image-picked up at each predetermined timing. Therefore, the first detecting section detects displacement of the recording stage both in the moving direction and in the intersecting direction from the position, in the marking image, of the identical relative position of each of the markings.

In this way, it is possible to detect displacement of the recording stage both in the moving direction and in the intersecting direction by image-picking up the markings on the recording stage at each predetermined timing. Further, displacement can be detected in such a manner that plural rows of markings are image-picked up even with only one image-picking up section, thereby allowing reduction in the cost of the exposure apparatus.

In a fifteenth aspect of the invention, one or plural length-measuring portions are provided on the recording stage, and wherein the displacement detecting section comprises: a first laser length-measuring machine that is disposed in the intersecting direction with respect to the stage surface of the recording stage, and measures a distance to the length-measuring portion of the recording stage at each predetermined timing; a second detecting section that, based on variations in the distance to the length-measuring portion of the recording stage, which distance is measured by the first laser length-measuring machine, detects displacement in the intersecting direction, a second laser length-measuring machine that is disposed in the moving direction with respect to the recording stage and that measures a distance to the recording stage at each predetermined timing; a second moving section that moves the second laser length-measuring machine in the intersecting direction in a range in which the distance to the recording stage can be measured; and a third detecting section that, based on intervals in which the distance to the recording stage measured by the second laser length-measuring machine varies at each predetermined timing, detects displacement of the recording stage in the moving direction thereof.

According to the fifteenth aspect, a first laser length-measuring machine is disposed in the direction intersecting the direction in which the recording head and the recording stage move relatively with respect to the stage surface of the recording stage, and can measure a distance to the length-measuring portion of the recording stage at each predetermined timing. At this time, when no displacement caused by zigzag movement occurs in the recording stage, the recording stage moves straightly in the moving direction, and therefore, the distance to the length-measuring portion, which is measured by the first laser length-measuring machine, becomes fixed. Accordingly, the second detecting section can detect displacement caused by zigzag movement of the recording stage from variations in the distance to the length-measuring portion of the recording stage, which distance is measured by the first laser length-measuring machine at each predetermined timing.

Further, the second laser length-measuring machine is disposed in the direction in which the recording head and the recording stage move relatively to each other, and can measure a distance of the recording stage which moves, at each of the aforementioned predetermined timing. At this time, when no displacement caused by pitching vibration occurs in the recording stage, the distance to the recording stage which is measured by the second laser length-measuring machine at each predetermined timing varies at each fixed interval. Accordingly, the third detecting section can detect displacement of the recording stage from intervals in which the distance to the recording stage measured by the second laser length-measuring machine varies at each predetermined timing. Further, the second moving section can move the second laser length-measuring machine in the direction intersecting the recording stage, and therefore, can detect displacement at each of the plural positions.

In this way, by carrying out the length-measuring operation using the first laser length-measuring machine and the second laser length-measuring machine at each predetermined timing, it becomes unnecessary to carry out forming markings on the recording stage.

In a sixteenth aspect of the invention, the displacement detecting section comprises: a position pattern exposure section that forms by exposure a predetermined position-data-acquiring pattern on the recording medium; and a registration section that registers, in the storage section, the shift-amount data of the displacement in the moving direction and the shift-amount data of the displacement in the intersecting direction obtained from the position-data-acquiring pattern formed by exposure by the position pattern exposure section.

According to the sixteenth aspect, the position pattern exposure section forms by exposure a predetermined position-data-acquiring pattern, and therefore, can obtain displacement both in the moving direction and in the intersecting direction by measuring the intervals between markings on the exposure-formed pattern, or the like. The registration section can register, in the storage section, shift-amount data of the obtained displacement in the moving direction and shift-amount data of the obtained displacement in the intersecting direction, thereby making it possible to correct displacement both in the moving direction and in the intersecting direction based on the shift-amount data in the moving direction and the shift-amount data in the intersecting direction, which shift-amount data is both stored in the storage section. Accordingly, a fine image can be formed on the recording medium.

In a seventeenth aspect of the invention, the markings are provided on the recording stage by mounting a marking chart on which markings are formed on the recording stage.

According to the seventeenth aspect, the formation of markings can be carried out on the recording stage by mounting a marking chart on the recording stage. Therefore, the marking positions can be appropriately changed. Further, when no marking is required, the marking chart can be removed.

In an eighteenth aspect of the invention, the displacement detecting section detects the displacement at each of positions corresponding to all the recording heads.

According to the eighteenth aspect, the displacement detecting means can detect an amount of displacement at each of plural positions. Therefore, by detecting the displacement at each of positions corresponding to all the recording heads, these recording heads each can be corrected in a most suitable manner.

A nineteenth aspect of the invention is an exposure method in which an image is formed on a recording medium mounted on a recording stage by irradiating a light beam based on image data from a recording head while the recording head and the recording stage are relatively moved, to allow the image to be formed by exposure on the recording medium, the method comprising: storing in advance, in a storage section, shift-amount data of a detected displacement of an image-form position with respect to a stage surface of the recording stage in a direction intersecting a direction in which the recording stage moves, which displacement occurs accompanied by movement of the recording stage; carrying out shifting for each of pixels of an image formed by the image data based on the shift-amount data stored in the storage section; and controlling exposure for the recording medium based on image data of the shifted image.

According to the nineteenth aspect, the same operation as that of the first aspect is obtained. Therefore, a fine image can be formed on the recording medium in the same manner as in the first aspect. Further, image shift is carried out based on the shift-amount data stored in the storage section, and therefore, the processing load in the exposure processing is reduced.

A twentieth aspect of the invention is an exposure method in which an image is formed on a recording medium mounted on a recording stage by irradiating light beams based on image data from plural recording heads arranged linearly while the recording heads and the recording stage are relatively moved in a direction intersecting a direction in which the recording heads are arranged, to allow the image to be formed by exposure on the recording medium, the method comprising: storing in advance, in a storage section, shift-amount data of a detected displacement of an image-form position with respect to a stage surface of the recording stage in a direction intersecting a direction in which the recording stage moves, which displacement occurs accompanied by movement of the recording stage; dividing an image formed by the image data into separate images which are respectively formed by the plurality of recording heads; carrying out shifting for each of pixels of the separate images based on the shift-amount data stored in the storage section; carrying out trimming the shifted separate images at positions at which the shifted separate images are connected; and controlling exposure for the recording medium by the recording heads based on respective image data of the separate images subjected to the trimming.

According to the twentieth aspect, the same operation as that of the second aspect is obtained. Therefore, in the same manner as in the second aspect, even when an image is recorded by the plurality of recording heads, image data is divided into image regions respectively for the recording heads, and image shift is carried out for each separate image region, thereby making it possible to correct distortion of an image to be drawn. Accordingly, a fine image can be formed on the recording medium.

A twenty first aspect of the invention is an exposure method in which an image is formed on a recording medium mounted on a recording stage by irradiating a light beam based on image data from a recording head while the recording head and the recording stage are relatively moved, to allow the image to be formed by exposure on the recording medium, the method comprising: storing in advance, in a storage section, shift-amount data in a moving direction in which the recording stage moves and shift-amount data in an intersecting direction intersecting the moving direction, of a detected displacement of an image-form position with respect to a stage surface of the recording stage, which displacement occurs accompanied by movement of the recording stage; carrying out modification so as to delete or add a line or lines extending along the intersecting direction, from or to an image formed by the image data based on the shift-amount data in the moving direction stored in the storage section; carrying out shifting for each of pixels of the modified image based on the shift-amount data in the intersecting direction which is stored in the storage section; and controlling exposure for the recording medium based on image data of the shifted image.

According to the twenty first aspect, the same operation as that of the tenth aspect is obtained. Therefore, in the same manner as in the tenth aspect, it is possible to correct an image to be drawn in accordance with displacement both in the moving direction and in the intersecting direction, which displacement is both caused by movement of the recording stage. Accordingly, a fine image can be formed on the recording medium.

A twenty second aspect of the invention is an exposure method in which an image is formed on a recording medium mounted on a recording stage by irradiating light beams based on image data from plural recording heads arranged linearly while the recording heads and the recording stage are relatively moved in a direction intersecting a direction in which the recording heads are arranged, to allow the image to be formed by exposure on the recording medium, the method comprising: storing in advance, in a storage section, shift-amount data in a moving direction in which the recording stage moves and shift-amount data in an intersecting direction intersecting the moving direction, of a detected displacement of an image-form position with respect to a stage surface of the recording stage, which displacement occurs accompanied by movement of the recording stage; carrying out modification so as to delete or add a line or lines extending along the intersecting direction, from or to an image formed by the image data based on the shift-amount data in the moving direction stored in the storage section; dividing the modified image into separate images which are respectively formed by the plurality of recording heads; carrying out shifting for each of pixels of the separate images based on the shift-amount data in the intersecting direction which is stored in the storage section; trimming the shifted separate images at positions at which the shifted separate images are connected; and controlling exposure for the recording medium by the recording heads based on respective image data of the separate images subjected to the trimming.

According to the twenty second aspect, the same operation as that of the eleventh aspect is obtained. Therefore, in the same manner as in the invention of the eleventh aspect, even when an image is recorded by the plurality of recording heads, an image formed by image data is corrected in accordance with displacement of the recording stage in the moving direction, and is divided into separate images respectively for the recording heads, and further, image shift is carried out for each separate image. Thus, distortion of an image to be drawn can be corrected. Accordingly, a fine image can be formed on the recording medium.

BRIEF DESCRIPTION OF THE DRAWINGS

FIG. 1A is a perspective view schematically showing an exposure apparatus according to a first embodiment of the present invention and FIG. 1B is an enlarged view.

FIG. 2 is a side view schematically showing the exposure apparatus according to the first embodiment.

FIGS. 10A to 10D are diagrams showing the flow of image shift processing according to the first embodiment.

FIGS. 14A and 14B show detection of displacement caused by zigzag movement of an exposure stage using a laser length-measuring machine.

FIG. 21 is a diagram showing a shift amount in a moving direction at each of intervals between markings according to the third embodiment.

FIGS. 23A and 23B are flow charts showing the flows of image pick-up processing, shift-amount calculation processing, and control of exposure processing, in accordance with the third embodiment.

DETAILED DESCRIPTION OF THE INVENTION

First Embodiment

Figure 3A:
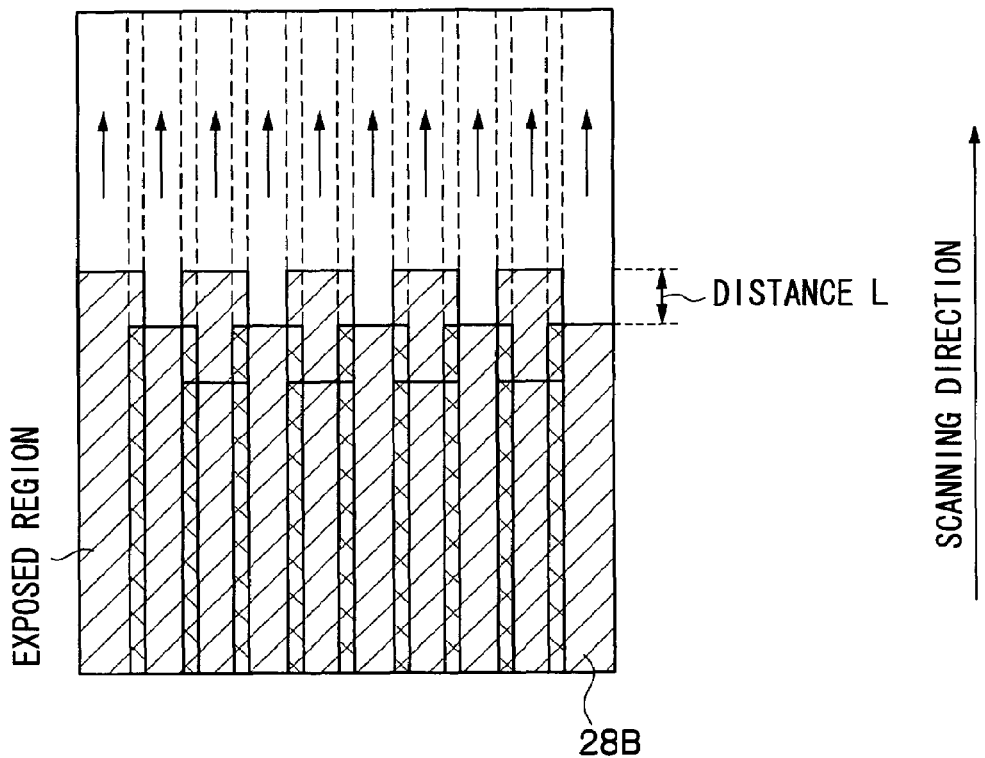
FIG. 3A is a plan view showing a region exposed by an exposure head unit.

FIG. 1A and FIG. 2 show a flatbed type exposure apparatus 10 according to a first embodiment of the present invention.

The exposure apparatus 10 is structured in such a manner that various parts are accommodated in a rectangular frame body 12 that is formed by assembling bar-shaped square pipes in the form of a frame. The frame body 12 is shut off between the inside and outside thereof by attaching a panel (not shown) thereto.

The frame body 12 is formed by a long tall housing portion 12A, and a stage portion 12B provided so as to project from one side surface of the housing portion 12A.

The stage portion 12B is provided so that the upper surface thereof is lower that the housing portion 12A. When an operator stands in front of the stage portion 12B, the upper surface of the stage portion 12B is positioned substantially at the height of the operator's waist.

An opening and closing cover 14 is provided on the upper surface of the stage portion 12B. A hinge (not shown) is mounted at one side of the opening and closing cover 14 adjacent to the housing portion 12A, and the opening and closing cover 14 can be operated so as to open and close around the side at which the hinge is mounted.

On the upper surface of the stage portion 12B in a state in which the opening and closing cover 14 is opened, an exposure stage 16 serving as a recording stage can be exposed to the outside.

The exposure stage 16 is supported via a pair of sliding rails 20 disposed along the longitudinal direction of a surface plate 18, and is made slidable in the direction indicated by arrow y in FIG. 1A by means of driving force of a linear motor 26 (see FIG. 2) provided below the exposure stage 16. Moreover, although not seen in FIG. 1A and FIG. 2, a linear encoder 27 (see FIG. 7) is provided below the exposure stage 16, and a pulse signal is outputted accompanied by movement of the exposure stage 16 and allows detection of positional information and scanning rate of the exposure stage 16 along the sliding rails 20. The linear encoder 27 of the first embodiment is adapted to output a pulse each time the exposure stage 16 moves a predetermined amount (for example, 0.1 μm).

The recording medium 22 is positioned on the upper surface of the exposure stage 16.

Further, markings 24 are provided aside of the recording medium 22 on the upper surface of the exposure stage 16 so as to be arranged at predetermined intervals (in the first embodiment, at intervals of 10.0 mm) along the directions indicated by double-headed arrow y (since the markings 24 on the exposure stage 16 are fine, they are drawn as a broken line along the directions indicated by double-headed arrow y in FIG. 1A, and FIG. 1B shows an enlarged view of the markings 24).

The exposure head unit 28 is disposed substantially at the intermediate position of the movement route of the exposure stage 16 on the surface plate 18 (in the directions indicated by double-headed arrow y).

The exposure head unit 28 is provided so as to be hung between a pair of supporting posts 30 which are formed upright on the surface plate 18 respectively (at the outer sides of the exposure stage 16) at both transverse-direction ends of the surface plate 18. That is, a gate is thus formed in which the exposure stage 16 passes through a region between the exposure head unit 28 and the surface plate 18.

The exposure head unit 28 is structured in such a manner that a plurality of head assemblies 28A are arranged along the transverse direction of the surface plate 18. By irradiating multiple light beams (described below in detail) emitted from the respective head assemblies 28A at a predetermined timing to the recording medium 22 on the exposure stage 16 while carrying out reciprocating movement of the exposure stage 16, a photosensitive material can be exposed.

Figure 3B:
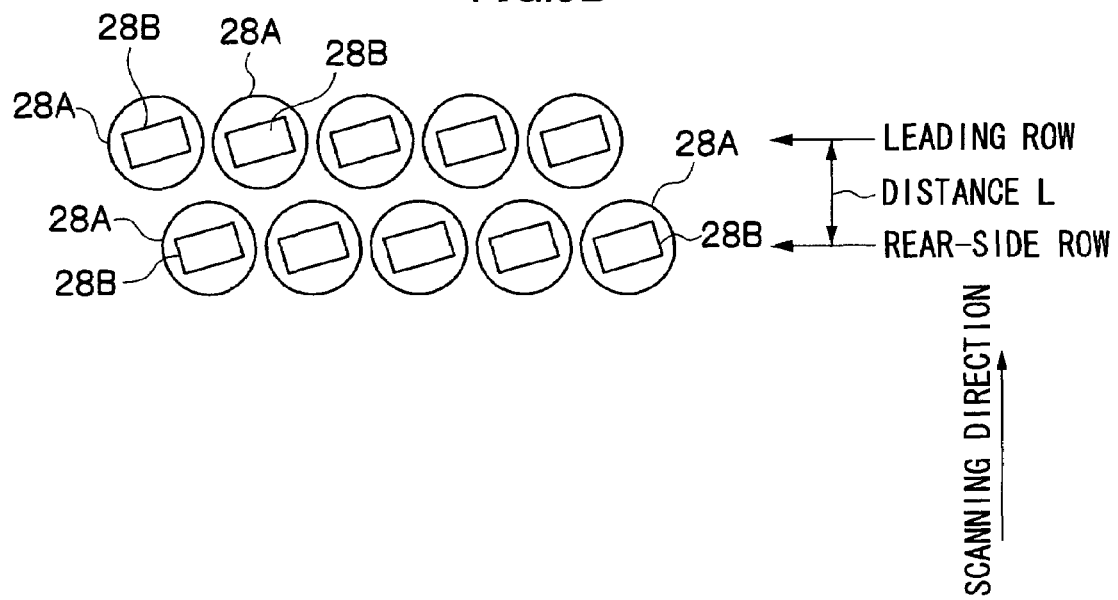
FIG. 3B is a plan view showing an arrangement pattern of a head assembly.

As shown in FIG. 3B, the head assemblies 28A which form the exposure head unit 28 are arranged substantially in the form of a matrix of m rows and n columns (for example, two rows and five columns). These plural head assemblies 28A are arranged in a direction perpendicular to the direction in which the exposure stage 16 is moved (hereinafter referred to as a scanning direction). In the first embodiment, based on the relationship with the transverse dimension of the recording medium 22, ten head assemblies 28A in total are arranged in two rows.

An exposure area 28B of one head assembly 28A is in the shape of a rectangle in which sides along the scanning direction are shorter, and is inclined with respect to the scanning direction by a predetermined angle of inclination. Accompanied by movement of the exposure stage 16, a band-shaped exposed region is formed on the recording medium 22 for each head assembly 28A (see FIG. 3A).

As shown in FIG. 1A, light source units 31 are disposed within the housing portion 12A at positions where movement of the exposure stage 16 on the surface plate 18 is not impeded thereby. The light source units 31 each accommodate multiple lasers (semiconductor lasers), and guide light emitted from the lasers to the respective head assemblies 28A via optical fibers (not shown).

Each of the head assemblies 28A controls, in units of dot, an incident light beam guided by the optical fiber, by means of a digital micro-mirror device (DMD) (not shown) that is a spatial light modulator, and exposes the recording medium 22 to form a dot pattern. In the first embodiment, the density of one pixel is represented using the multiple dot patterns.

Figure 4:
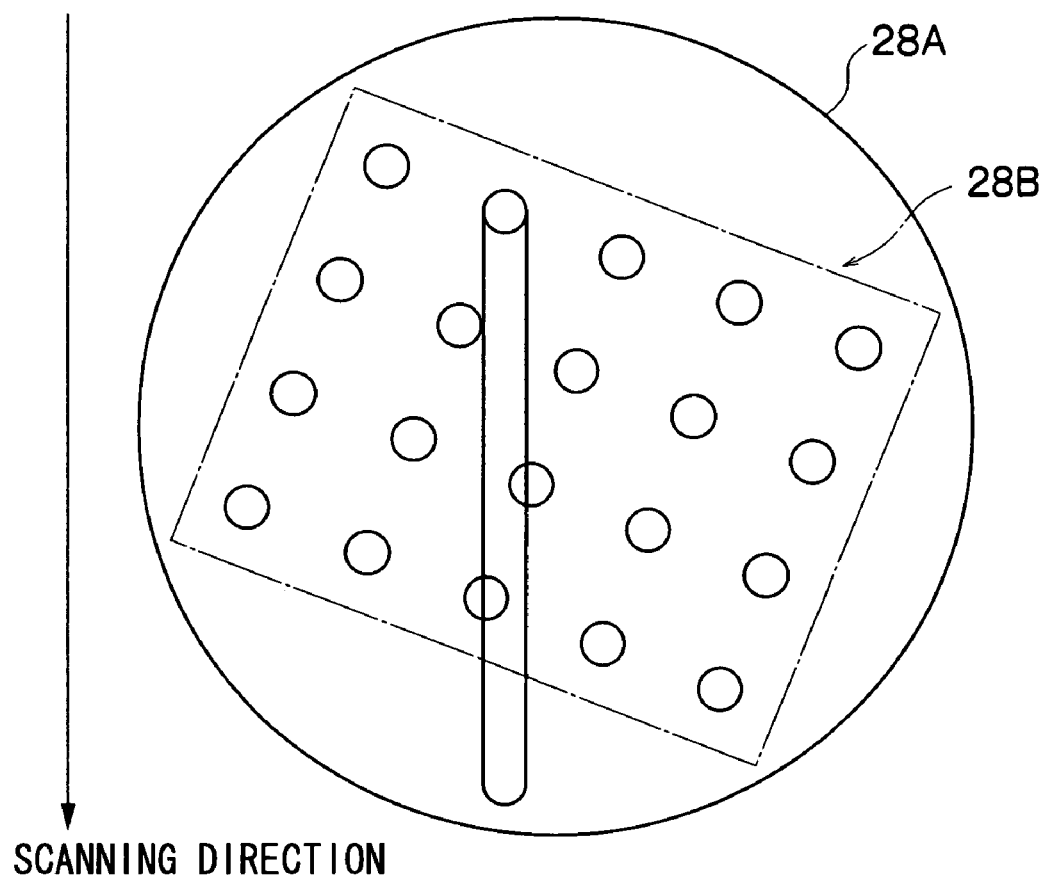
FIG. 4 is a plan view showing a state in which a dot pattern is arranged in a single head assembly.

As shown in FIG. 4, the aforementioned band-shaped exposed region (the exposure area 28B in one head assembly 28A) is formed by 20 dots that are disposed in a two-dimensional array (for example, 4×5).

Further, the aforementioned dot pattern in the two-dimensional array is inclined with respect to the scanning direction, and therefore, each of the dots arranged in the scanning direction is adapted to pass through between the dots which are arranged in the direction intersecting the scanning direction. Thus, an effective pitch between dots can be narrowed down, and a high resolution can be achieved.

In the stage portion 12B (see FIG. 1A), exposure processing for the recording medium 22 positioned on the-exposure stage 16 is carried out, not when the exposure stage 16 on which the recording medium 22 is placed is moved to the back of the apparatus along the sliding rails 20 on the surface plate 18 (forward movement), but when the exposure stage 16, after having arrived at the end of the surface plate 18 at the back of the apparatus, returns to the stage portion 12B (backward movement).

That is, the forward motion is that for obtaining positional information of the recording medium 22 on the exposure stage 16. As a unit required for obtaining the positional information, an alignment unit 32 (see FIG. 2) is disposed above the surface plate 18.

The alignment unit 32 is disposed at the central portion of the exposure head unit 28 at the back of the apparatus in the forward direction of the exposure stage 16. The alignment unit 32 irradiates light onto the recording medium 22 on the exposure stage 16 during the forward movement, and photographs the reflected light and puts a mark on the recording medium 22.

The relative positional relationship between the exposure stage 16 and the recording medium 22 is determined by an operator's mounting the recording medium 22 on the exposure stage 16, and therefore, minor displacement may occur. The displacement is recognized by the aforementioned photographed mark, and the timing of starting exposure by the exposure head unit 28 having a known relative relationship with the exposure stage 16 is corrected. Thus, the relative position of the recording medium 22 to an image is set as a desired position thereof.

Incidentally, zigzag movement occurs in the exposure stage 16 accompanied by movement thereof, and therefore, displacement occurs on the exposure stage 16. As a result, distortion is caused in an image formed by exposing the recording medium 22 on the exposure stage 16. This zigzag movement has a high reproducibility based on movement of the exposure stage 16. Therefore, it is possible to correct distortion of an image to be formed by exposing the recording medium 22 by carrying out correction by detecting displacement caused by zigzag movement in advance.

Figure 5:
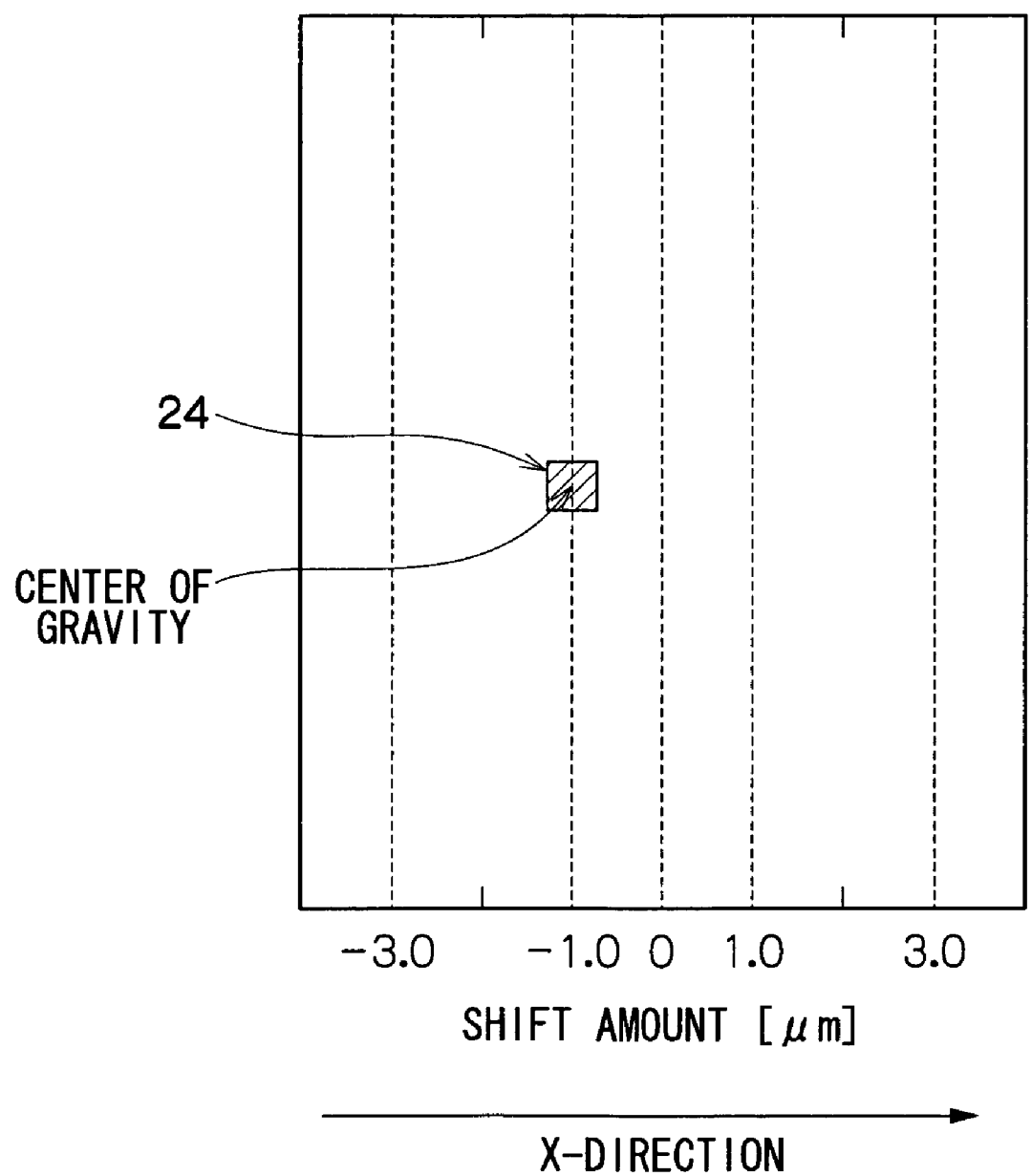
FIG. 5 is a diagram showing a marking image obtained by a CCD camera 34 according to the first embodiment.

Accordingly, a CCD camera 34 (see FIG. 1) is provided for detecting displacement of the exposure stage 16 caused by zigzag movement that occurs due to movement of the exposure stage 16. The CCD camera 34 is disposed at the front side of the exposure head unit 28 in the forward route direction, and can be positioned by a built-in linear motor serving as moving means, along a rail 35 provided along the transverse direction of the exposure head unit 28 (i.e., the directions indicated by double-headed arrow x in FIG. 1A), thereby allowing pick-up of the markings 24 on the exposure stage 16. A marking image obtained by the CCD camera 34 includes a benchmark used to determine the position of the obtained marking 24 (in the first embodiment, the center in the direction indicated by arrow x is set as the benchmark (0) as shown in FIG. 5), and an amount of shift between the position of the marking 24 in an image and the benchmark can be detected.

In other words, in the exposure apparatus 10, distortion of an image formed by exposure on the recording medium 22 is corrected in such a manner that displacement caused by zigzag movement is detected by image-picking up the marking 24 using the CCD camera 34 at each pickup timing and image data is shifted.

Figure 6A:
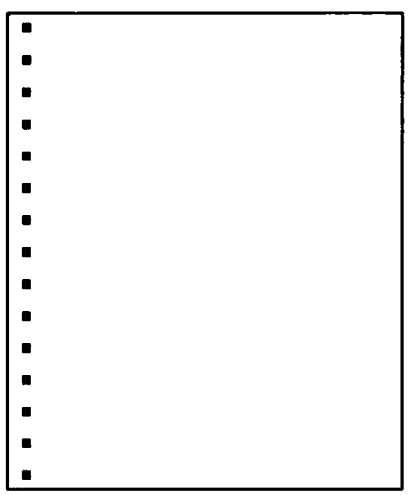
FIGS. 6A to 6D are diagrams each showing a pattern of markings.
Figure 6C:
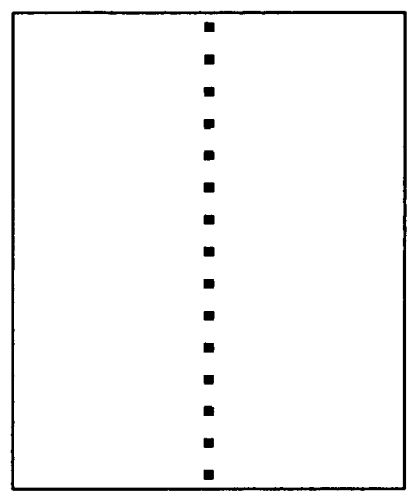
Figure 6B:
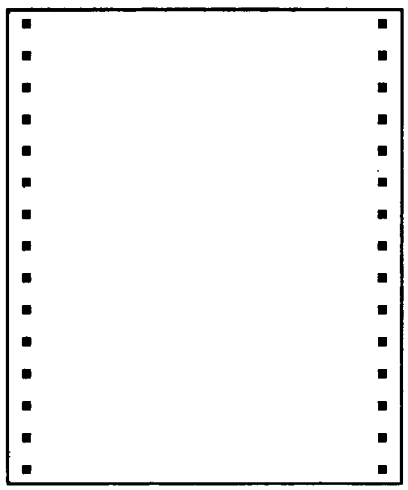
Figure 6D:
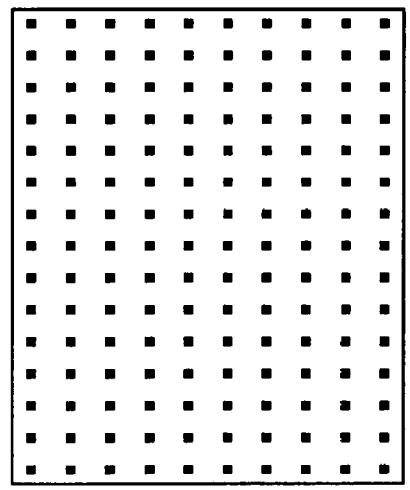

In the first embodiment, one row of markings 24 are provided at one end of the exposure stage 16 as shown in FIG. 6A. However, in a case in which plural rows of markings 24 are provided, for example, the rows of markings 24 are provided respectively at both sides of the exposure stage 16 as shown in FIG. 6B, displacement caused by zigzag movement can be detected at the respective sides by moving the CCD camera 34 along the rail 35. Further, when an image is image-picked up by the CCD camera 34, displacement may be detected by mounting, on the exposure stage 16, a marking chart (a glass base plate or the like) as shown in FIG. 6C or 6D. In this way, since the CCD camera 34 can be moved along the rail 35, displacement caused by zigzag movement can also be detected for each of the positions of the head assemblies 28A.

Figure 7:
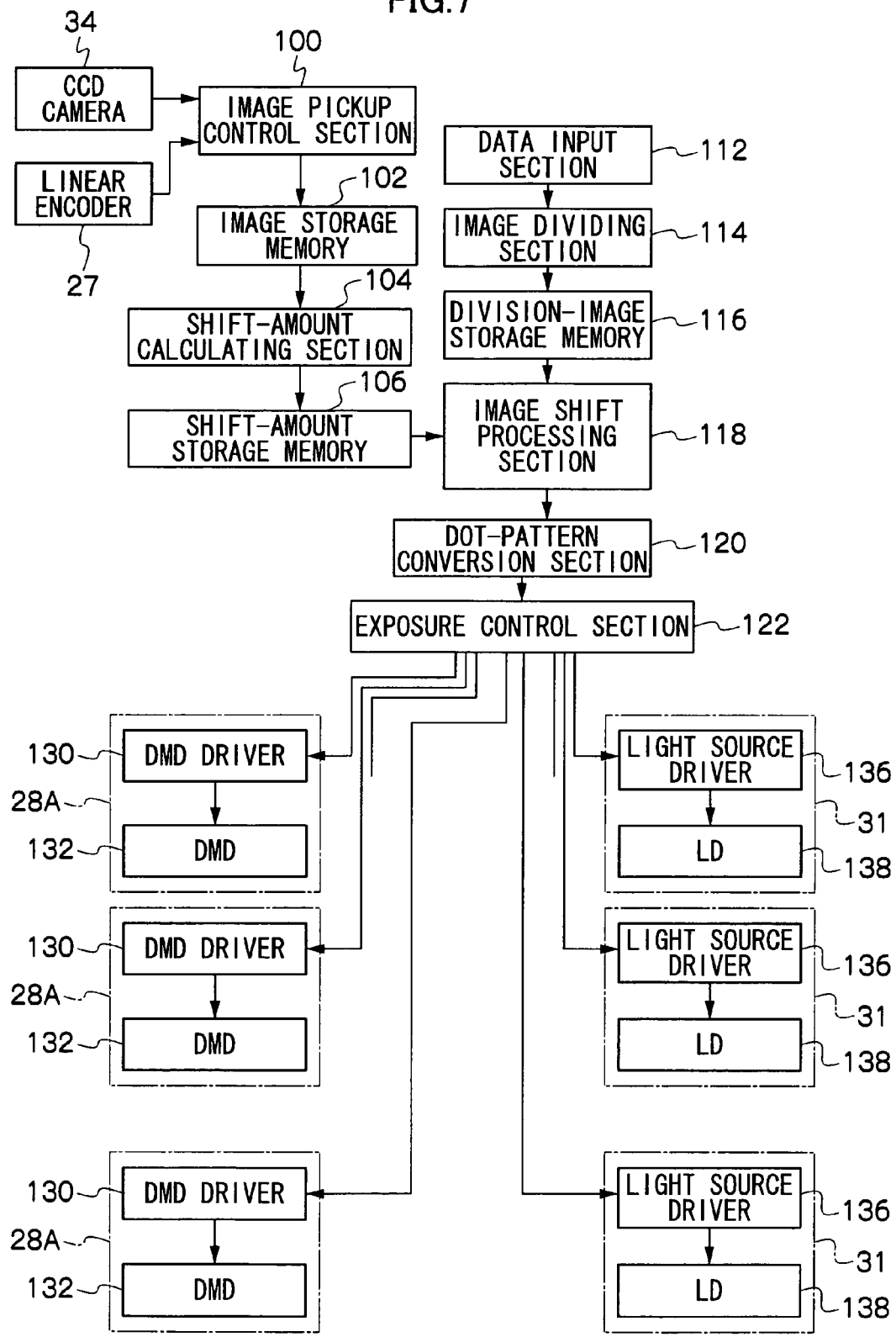
FIG. 7 is a functional block diagram for control in detecting displacement caused by zigzag movement of an exposure stage, and carrying out exposure, in accordance with the first embodiment.

FIG. 7 shows a functional block diagram for controlling so as to detect displacement caused by zigzag movement of the exposure stage 16 and carry out exposure in the exposure apparatus 10 of the first embodiment.

An image-pickup control section 100 is connected to the linear encoder 27, the CCD camera 34 and the image storage memory 102. The image-pickup control section 100 obtains the marking 24 on the exposure stage 16 using the CCD camera 34 for each pickup timing obtained by counting 100,000 pulses from the linear encoder 27 detected due to movement of the exposure stage 16, and stores, in the image storage memory 102, the obtained marking image together with the position of the row of the markings 24 (in the direction indicated by arrow X in FIG. 1B) obtained from a linear motor built into the CCD camera 34. Incidentally, in the linear encoder 27 applied to the first embodiment, when the stage 16 moves a distance of 0.1 μm, one pulse is outputted, and the intervals of the markings 24 are each 10.0 mm. Therefore, by making 10.0 mm/0.1 μm (=100,000), the aforementioned 100,000 pulses allows image-picking up according to the intervals of markings 24.

The image storage memory 102 is connected to the image-pickup control section 100 and also to a shift-amount calculating section 104. The image storage memory 102 stores therein a marking image obtained with the image-pickup control section 100, and the marking image is read out by the shift-amount calculating section 104.

Figure 8:
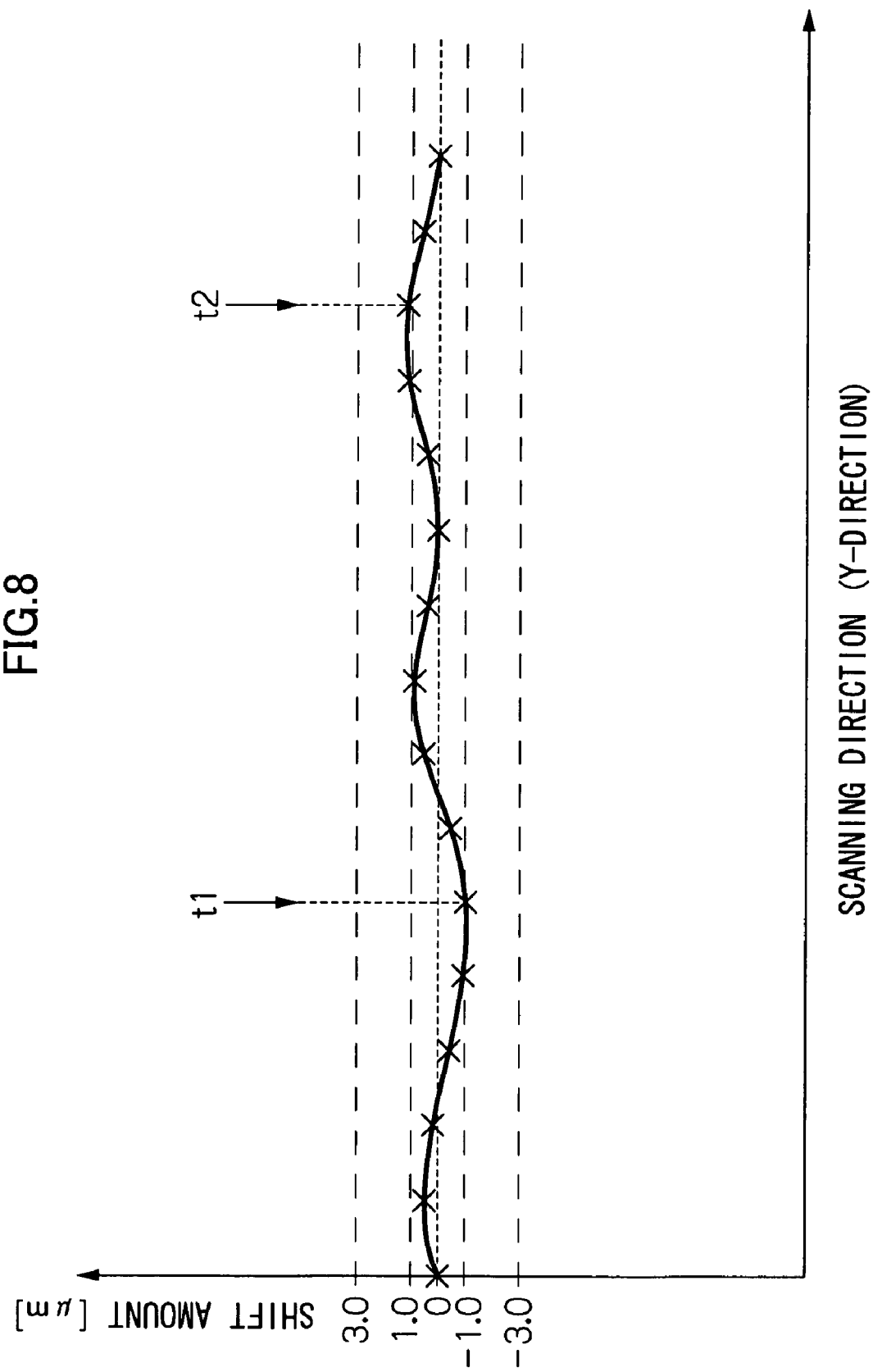
FIG. 8 is a graph showing a shift amount of displacement caused by zigzag movement in accordance with the first embodiment.

The shift-amount calculating section 104 is connected to the image storage memory 102 and a shift-amount storage memory 106. The shift-amount calculating section 104 obtains a center-of-gravity position as the same relative position of the marking 24 from the marking image obtained by the image pickup control section 100, and detects, for each of rows of the markings 24, a shift amount of the exposure stage 16 caused by zigzag movement from the center-of-gravity position in the marking image with respect to the benchmark (0), as shown in FIG. 5. In this case, the interval of the markings 24 is 10.0 mm, and therefore, shift amounts at various positions within the range of 10.0 mm cannot be continuously obtained. Accordingly, based on the detected shift amounts, the shift-amount calculating section 104 carries out interpolation processing and calculates the shift amount at each of various positions in the interval of 10.0 mm, and stores these shift amounts in the shift-amount storage memory 106. In this interpolation processing, as shown in FIG. 8, a curved line (zigzag curve) of shift amounts caused by zigzag movement, which passes through the shift amounts (indicated by the "x" marks) obtained from the marking image, is obtained, and based on the zigzag curve, the shift amounts between the adjacent markings 24 (in the interval of 10.0 mm) are calculated.

The shift-amount storage memory 106 is connected to the shift-amount calculating section 104 and an image shift processing section 118. The shift-amount storage memory 106 stores therein the shift amounts (shift-amount data) calculated from the zigzag curve, and at the time of exposure processing, the shift amounts are read out by the image shift processing section 118.

The data input section 112 is connected to an image dividing section 114. Inputted to the data input section 112 is an image to be formed by exposure on the recording medium 22. The inputted image data is transferred to the image dividing section 114.

Figure 9:
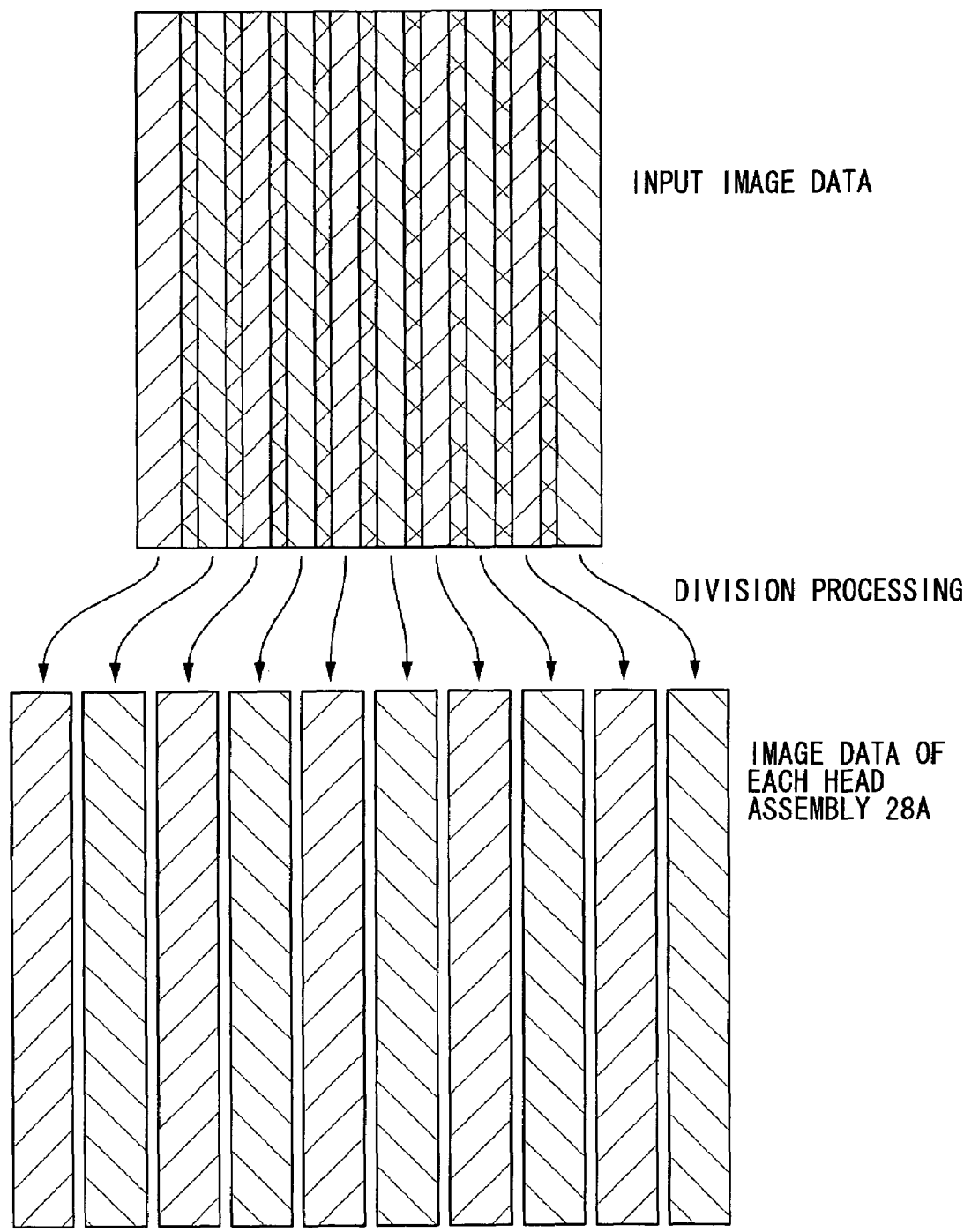
FIG. 9 is a diagram showing division processing of input image data in accordance with the first embodiment.

The image dividing section 114 is connected to the data input section 112 and a division-image storage memory 116. The exposure head unit 28 of the exposure apparatus 10 is formed by plural head assemblies 28A as shown in FIG. 3B. Therefore, the image dividing section 114 divides image data transferred from the data input section 112 into respective image data of the head assemblies 28A as shown in FIG. 9, and stores these image data in the division-image storage memory 116.

The division-image storage memory 116 is connected to the image dividing section 114 and the image shift processing section 118. The division-image storage memory 116 stores therein respective image data into which an image is divided for each head assembly 28A, and each image data is read out by the image shift processing section 118.

The image shift processing section 118 is connected to the division-image storage memory 116, the shift-amount storage memory 106, and a dot-pattern conversion section 120. The image shift processing section 118 reads out, from the division-image storage memory 116, image data to be exposed for each head assembly 28A. As shown in FIG. 3B, the head assemblies 28A are arranged in two rows, a distance L is provided between the leading row and the rear-side row. As a result, the image data for the leading row of head assemblies 28A and the image data for the rear-side row of head assemblies 28A, which image data is read by the image shift processing section 118, differ from each other by a distance L. Further, the image shift processing section 118 carries out image shift processing (described later) for each of the read image data on the basis of the shift amount based on the zigzag curve stored in the shift-amount storage memory 106, and transfers the data to the dot-pattern conversion section 120.

In this image shift processing, first, a shift amount in carrying out image shift in each head assembly 28A is obtained. If plural rows of markings 24 are provided, the shift amounts are obtained by the plural positions located in the direction indicated by arrow X in FIG. 1B, and therefore, the shift amount at the position at which each head assembly 28A is located in the x-direction is calculated and obtained from the shift amount for each of the marking rows. This calculation may be carried out by interpolation processing, or an approximate line may be obtained by calculation from the shift amounts of the respective rows of markings 24. As a result, the shift amount in carrying out image shift at the position of each head assembly 28A (the position in the x-direction) can be obtained. Incidentally, if only one row of markings 24 is provided, image shift is carried out based on the shift amounts in one row with all the head assemblies 28A. Further, in a case in which the row of markings 24 is provided for each of the respective positions of all the head assemblies 28A, image shifting for each head assemblies 28A is carried out on the basis of the respective shift amounts obtained from the corresponding rows.

Next, in the image shift processing, as shown in FIGS. 10A to 10D, portions, corresponding to widths of respective obtained shift amounts, of image regions adjacent to the original image data (FIG. 10A) of each head assembly 28A are read out from the division-image storage memory 116, and are added to both ends of the original image data of each head assembly 28A (the state shown in FIG. 10B). (if no adjacent image region is provided, a margin (having no image) region is added to the original image data) Subsequently, an entire image (the original image data with the portions of the adjacent image regions added thereto) is shifted in accordance with each of the obtained shift amounts (FIG. 10C). And then, trimming is carried out for the shifted image at a connecting-line position, and image data for which exposure is to be carried out by the head assembly 28A is prepared (FIG. 10D). Incidentally, in this image shift processing, an image is shifted in units of pixels, and therefore, the unit of correction can be of a pixel size (in the first embodiment, the image size is 2 μm).

The dot-pattern conversion section 120 is connected to the image shift processing section 118 and the exposure control section 122. The dot-pattern conversion section 120 converts image data of each head assembly 28A transferred from the image shift processing section 118, to data in units of dots for controlling the digital micro-mirror device (DMD), and further transfers the same to the exposure control section 122.

The exposure control section 122 is connected to the dot-pattern conversion section 120, respective head assemblies 28A, and respective light source units 31. The exposure control section 122 controls, based on dot-pattern data transferred from the dot-pattern conversion section 120, respective DMD drivers 130 of the plural head assemblies 28A to make respective DMD 132 on/off, and transfers a light-on signal to the light source driver 136 of each light source unit 31 to turn on the LD 138. Thus, image exposure processing on the recording medium 22 is carried out.

Next, the operation of the first embodiment will be described.

Flow of Shift-amount Calculation

In the exposure apparatus 10, calculation of the shift amounts based on the zigzag curve is carried out in such a manner that the CCD camera 34 moves along the rail 35 to a position at which the markings 24 of the exposure stage 16 can be imaged by the CCD camera 34, and images pick up the markings 24 while moving the exposure stage 16. Incidentally, when plural rows of markings 24 are provided on the exposure stage 16, calculation of the shift amount is carried out for each row of markings 24 (multiple times), and a zigzag curve is obtained for each of the positions of the row of the markings 24 (the positions at which the CCD camera 34 is located in the X-direction), and the shift amounts are stored in the shift-amount storage memory 106.

Figure 11A:
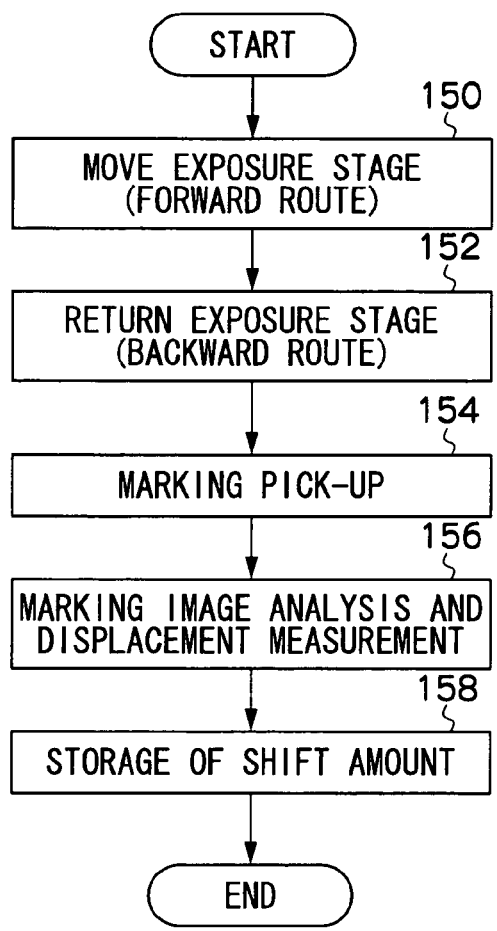
FIGS. 11A and 11B are flow charts showing the control flow of image-picking up processing, calculation and preparation of shift amounts, and exposure processing in accordance with the first embodiment.

FIG. 11A shows the control flow regarding shift-amount calculation.

In step 150, the exposure stage 16 (see FIG. 1) is moved by driving force of the linear motor 26 (see FIG. 2) along the sliding rails 20 of the surface plate 18 at a fixed speed from the stage portion 12B to the back of the housing portion 12A (forward movement), and when the exposure stage 16 arrives at the end of a forward route, the process proceeds to step 152.

In step 152, since the exposure stage 16 arrives at the end of the forward route, the direction in which the exposure stage 16 moves is reversed, and the exposure stage 16 is moved toward the stage portion 12B at a fixed speed (backward movement), and the process proceeds to step 154. In this case, displacement occurs in the exposure stage 16 due to zigzag movement caused by movement of the exposure stage 16.

In step 154, pulses from the linear encoder 27, which are generated due to movement of the exposure stage 16, are detected, and the markings 24 provided at intervals of 10 mm are imaged by the CCD camera 34 each time 100,000 pulses are counted up. When the backward movement is completed and all the markings 24 arranged on one row are imaged, the process proceeds to step 156.

In step 156, the center-of-gravity position of the marking 24 is obtained from each obtained marking image, and a shift amount of displacement caused by zigzag movement, from the center-of-gravity position in the marking image, is obtained. The process proceeds to step 158.

In step 158, a zigzag curve is obtained by interpolation processing from the shift amount at each marking 24, and a shift amount at each position in the scanning direction, which shift amount is calculated from the zigzag curve, is stored in the shift-amount storage memory 106, and the process ends.

Due to the aforementioned shift-amount calculation processing, the shift-amount storage memory 106 stores therein the shift amounts calculated for each of the rows of markings 24.

Flow of Exposure Processing

Next, exposure processing in which correction is carried out based on the calculated shift amount will be described.

In the exposure apparatus 10 (see FIG. 1A), when the recording medium 22 is mounted on the exposure stage 16 and image data to be exposed is inputted to the apparatus, the inputted image data is divided into respective image data for the head assemblies 28A, and further, image shift processing is carried out based on the shift amounts stored in the shift-amount storage memory 106, and image data to be exposed is prepared. The image data to be exposed is converted to dot-pattern data, and when exposure starting timing (described later) comes, the image is formed by exposure on the recording medium 22.

The exposure stage 16 with the recording medium 22 adhering to the surface thereof is moved by driving force of the linear motor 26 (see FIG. 2) along the sliding rails 20 of the surface plate 18 at a fixed speed from the stage portion 12B to the back of the housing portion 12A (forward movement). At this time, when the exposure stage 16 passes through the alignment unit 32, a mark given in advance to the recording medium 22 is detected. This mark is collated with a previously stored mark, and based on the positional relationship, the timing of starting exposure of the exposure head unit 28 is corrected.

When the exposure stage 16 arrives at the end of the forward route, the forward movement is reversed and the exposure stage 16 is moved back to the stage portion 12B at a fixed speed (backward movement). During this backward movement, when the exposure stage 16 passes through the exposure head unit 28, exposure processing is started at the corrected exposure starting timing.

When exposure processing is started, in the exposure control section 122, laser light is irradiated to the DMD based on the aforementioned dot-pattern data. The laser light reflected when the micro-mirror of DMD is in an on state is guided via an optical system to the recording medium 22 (see FIG. 1A), and an image is thereby formed on the recording medium 22.

At this time, when the exposure stage 16 moves, zigzag movement occurs on the exposure stage 16 due to movement thereof, and the recording medium 22 adhering to the surface of the exposure stage 16 also meanders (moves in the zigzag manner). As a result, displacement occurs on the recording medium 22 at a position in which an image is to be formed by a light beam from the exposure head unit 28. However, an image to be formed by exposure on the recording medium 22 is subjected to image shift processing based on the shift amount for each head assembly 28A, and therefore, distortion of an image to be formed by exposure on the recording medium 22 can be reduced.

Next, a description will be given of the control flow of exposure processing in accordance with the flow chart of FIG. 11B.

Figure 11B:
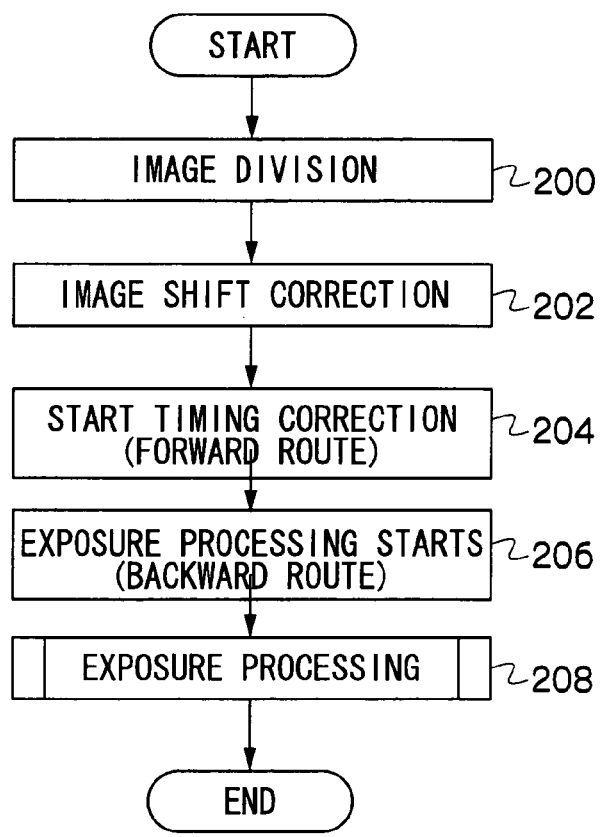

The processing shown in the flow chart of FIG. 11B starts in such a manner that image data is inputted by an operator to the exposure apparatus 10, and control for starting the process is performed.

In step 200, the inputted image data is divided into respective image data for the exposure head unit 28, and stored in the division-image storage memory 116. Then, the process proceeds to step 202.

In step 202, image shift processing is carried out based on the shift amounts calculated from the zigzag curve obtained for each row of markings 24, which shift amounts are stored in the shift-amount storage memory 106, and respective image data for the exposure head unit 28 is prepared and converted to dot-pattern data. Then, the process proceeds to step 204.

In the image shift processing of the first embodiment, since the unit of pixels is 2.0 µm, correction in the units of 2.0 µm becomes possible by carrying shift processing for each pixel. If the shift amount calculated by the zigzag curve is within the range of ±1.0 µm, no image shift processing is carried out. If the shift amount is greater than +1.0 µm or less than −1.0 µm, shift processing is carried out only for a required number of pixels, and displacement caused by zigzag movement and displacement of an image to be exposed are corrected so that the shift amount at each time is set within the range of ±1.0 µm.

For example, in a case in which the shift amount is smaller than −1.0 µm as indicated by arrow t1 in FIG. 8, correction for shifting pixels to a minus side by one pixel (2.0 µm) is carried out. Further, in a case in which the shift amount is larger than +1.0 µm as indicated by arrow t2 in FIG. 8, correction for shifting pixels to a plus side by one pixel (2.0 µm) is carried out. Moreover, for example, if the shift amount is −4.0 µm, correction for shifting pixels to a minus side by 2 pixels (4.0 µm) is carried out.

Figure 12:
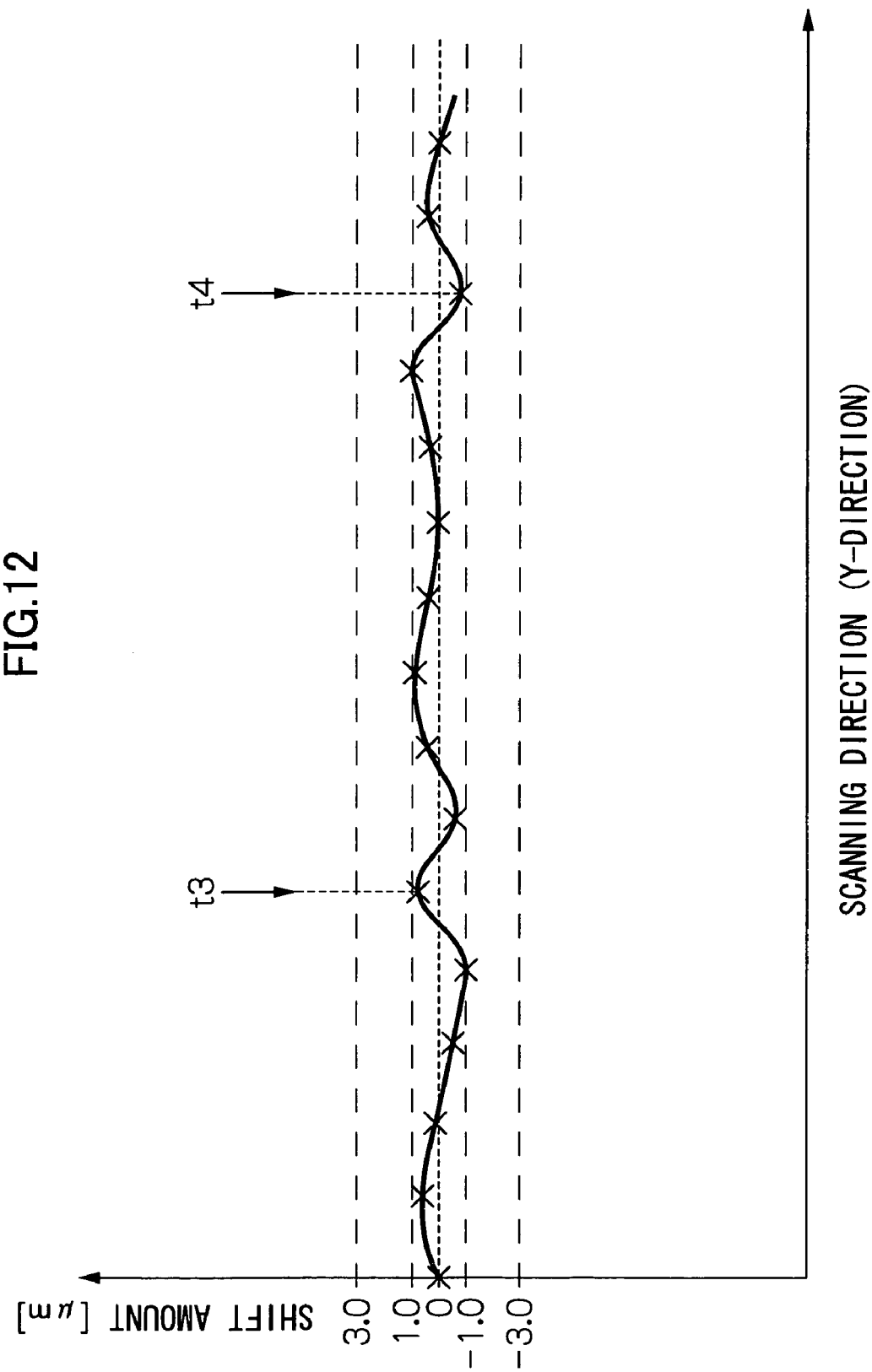
FIG. 12 is a graph showing the shift amounts between an image subjected to image shift processing based on the shift amounts shown in FIG. 8 in accordance with the first embodiment, and a position displaced by zigzag movement of an exposure stage.
Figure 13A:
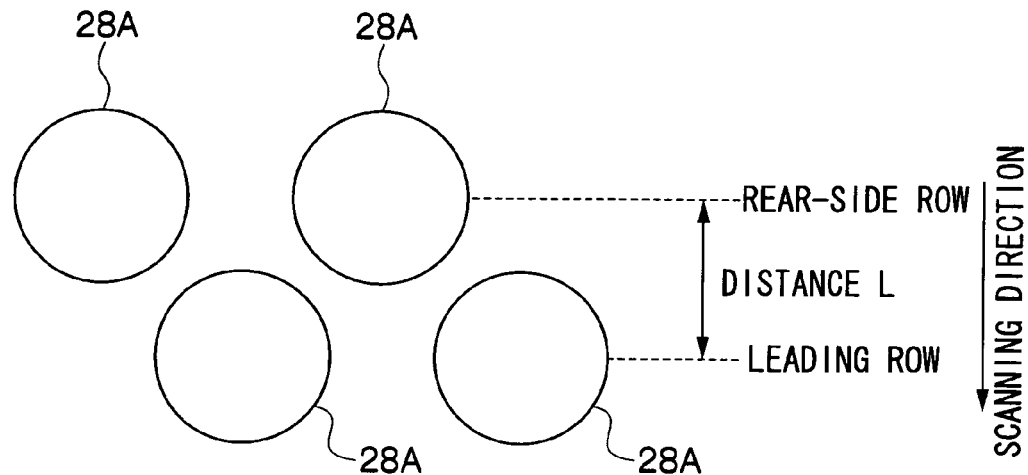
FIGS. 13A and 13B show images for exposure after image shift processing in the leading row and the rear-side row of head assemblies 28A in accordance with the first embodiment.
Figure 13B:
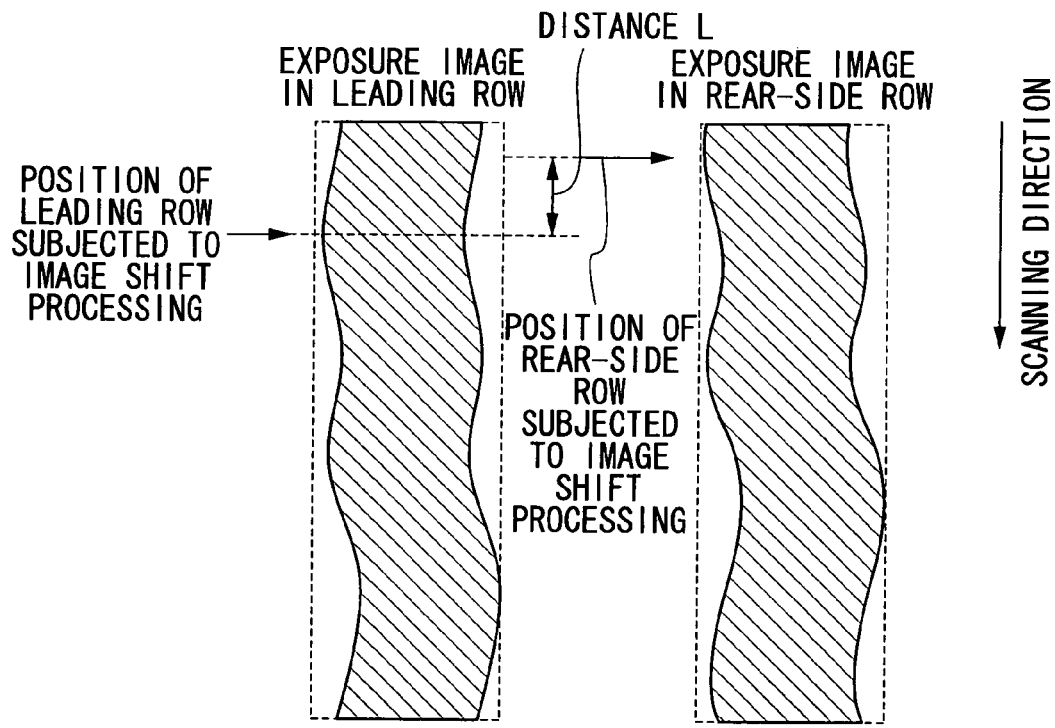

FIG. 12 shows the result obtained by carrying out image shift processing based on the shift amounts shown in FIG. 8. The shift amounts indicated by arrows t1 and t2 in FIG. 8 are respectively corrected as indicated by arrows t3 and t4 in FIG. 12. As shown in FIG. 13A, the head assemblies 28A are arranged in two rows, and therefore, image data for the leading row of head assemblies 28A and image data for the rear-side row of head assemblies 28A, which differ from each other by a portion of the distance L are read out, and shift processing is carried at respective positions of the leading row and the rear-side row, as is shown in FIG. 13B.

In step 204, the exposure starting timing is corrected by the alignment unit 32 by moving the exposure stage 16 in the forward direction (along the y-axis in FIG. 2, that is, from the front to the back of the apparatus) at a fixed speed. When the exposure stage 16 arrives at the end of the forward route, the process proceeds to step 206.

In step 206, when the exposure stage 16 is moved in the backward direction (along the y-axis in FIG. 2, that is, from the back to the front of the apparatus) at a fixed speed and the exposure starting timing corrected by step 202 comes, the process proceeds to step 208.

In step 208, the aforementioned exposure processing is carried out based on dot-pattern data converted from each image data subjected to the image shift processing. When all images are formed by exposure on the recording medium 22, the process proceeds to end and the exposure processing is terminated.

As described above, in the first embodiment, the shift amounts caused by zigzag movement that occurs in the exposure stage 16 can be detected at plural positions by making it possible to move one CCD camera 34. Further, by carrying out image shift processing of image data for each head assembly 28A based on the detected shift amount, distortion of an image to be drawn on the recording medium can be reduced.

Further, since the shift amount of displacement caused by zigzag movement at plural positions can be detected by one CCD camera 34, an increase in the manufacturing cost can be restrained.

Moreover, since correction is carried out by changing a position at which an image is to be drawn, it is not necessary to change the behavior of moving the exposure stage 16 for the purpose of correcting displacement.

Incidentally, in the image shift processing of the first embodiment (FIG. 10A to FIG. 10D), trimming of a connecting line (FIG. 10D), that is, connecting-line processing is carried out after the shift processing (FIG. 10C). However, it is also possible to carry out the connecting-line processing (image correction for making a connecting line obscure) before carrying out the shift processing.

Further, in the image shift processing, merging (adding) of regions each having the width of each shift amount is carried out (FIG. 10B) for the original image data of each head assembly 28A (FIG. 10A). However, when the image dividing section 114 (see FIG. 7) reads the shift amount from the shift-amount storage memory 106 and divides the image data into respective image data for the head assemblies 28A, it is possible that the image data is divided into respective image data for the head assemblies 28A such that regions each having the width of the shift amount are added in advance to the respective image data for each head assemblies 28A and thereafter the image data is divided into the respective image data for the head assemblies 28A. In this case, merging in the image shift processing becomes unnecessary.

Further, in the first embodiment, the shift amount of displacement caused by zigzag movement is detected by image-picking up the markings 24 on the exposure stage 16. However, a laser length-measuring machine 42, which is disposed in a direction intersecting the scanning direction with respect to the stage surface of the exposure stage 16 as shown in FIG. 14A, is used to measure a distance between the exposure stage 16 and the laser length-measuring machine 42, and based on variations in the distance, the shift amount of displacement caused by zigzag movement of the exposure stage 16 may also be detected. In the first embodiment, with the laser length-measuring machine 42 being connected to the shift-amount calculating section 104 (see FIG. 7), the shift amount of displacement caused by zigzag movement can be detected from variations in the distance between the exposure stage 16 and the laser length-measuring machine 42 (see the distance t5 in FIG. 14A), which distance is measured in the shift-amount calculating section 104 at each image-picking up timing. Further, by providing plural length-measuring portions 40 (FIG. 14B) in the exposure stage 16, the shift amounts of displacement caused by zigzag movement at plural positions can also be detected. In this manner, when the shift amount of displacement caused by zigzag movement is detected using the laser length-measuring machine 42, it is not necessary to provide the markings 24 in the exposure stage 16.

Furthermore, although the zigzag curve is obtained after image-picking up the markings 24 in the first embodiment, a shift amount of displacement caused by zigzag movement may also be detected by carrying out image-picking up of the markings 24 in real time at the time of moving the exposure stage 16 for exposure processing. In this case, it is only necessary that exposure processing is carried out in such a manner that the shift-amount detecting section 104 (see FIG. 7) sends the shift amount detected by the picked up image directly to the image shift processing section 118, the image shift processing section 118 carries out merging (adding) and shift (image shift processing) of image data separated in real time during the exposure processing, and the dot-pattern conversion section 120 converts the image data to dot-pattern data. This real-time correction can also be carried out when the shift amount is detected using the laser length-measuring machine 42. Due to the real-time correction, a slight difference in the amount of displacement caused by zigzag movement that occurs for each exposure processing can also be corrected.

Second Embodiment

Next, a second embodiment of the present invention will be described. The second embodiment is characterized in that the exposure apparatus 10 is used to form a pattern image for acquiring position data by exposure, detect a shift amount of displacement caused by zigzag movement by measuring the obtained pattern image, and register the detected shift amount in the shift-amount calculating section 104.

An exposure apparatus 10 of the second embodiment is not provided with the CCD camera 34 and the rail 35. Other parts of the exposure apparatus 10 are the same as those of FIGS. 1 and 2, and therefore, a description thereof will be omitted.

Figure 15:
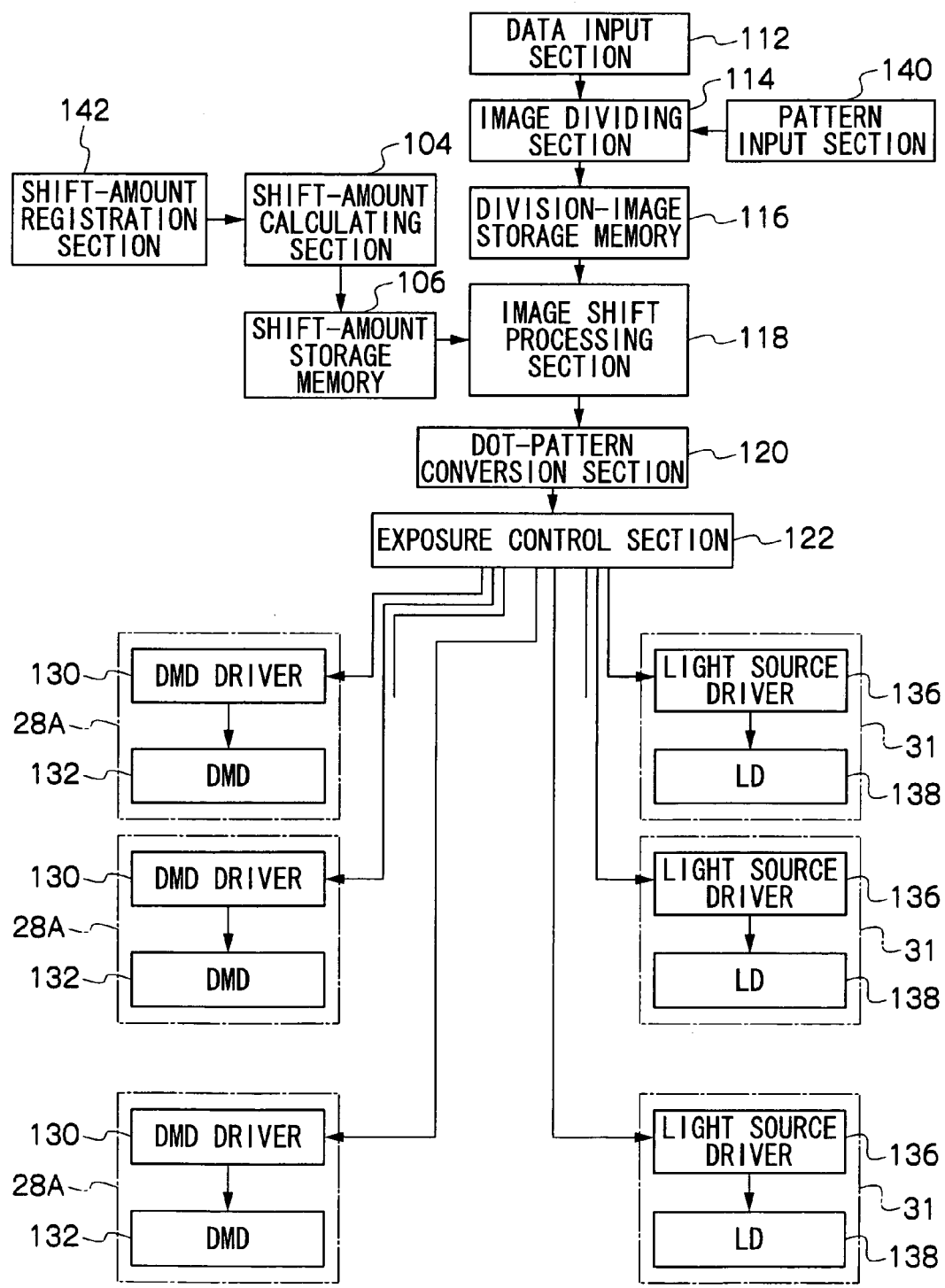
FIG. 15 is a functional block diagram for control in detecting displacement caused by zigzag movement of an exposure stage, and carrying out exposure, in accordance with a second embodiment.

FIG. 15 shows a functional diagram of the second embodiment. Note that the same parts as those of FIG. 7 in the first embodiment will be denoted by the same reference numerals, and therefore, a description thereof will be omitted and only different parts will be described below.

A pattern input section 140 is connected to an image dividing section 114. When the pattern input section 140 receives an instruction for exposure of a pattern image for acquiring position data to detect a shift amount of displacement caused by zigzag movement, it transfers plural rows of markings 24, as a pattern image, to the image dividing section 114 as shown in FIG. 6D. Due to transfer of the pattern image, image exposure processing on the recording medium 22 is carried out in the exposure apparatus 10. However, zigzag movement occurs due to movement of the exposure stage 16, and therefore, displacement occurs in an image to be actually formed by exposure. In the second embodiment, the shift amount is obtained by measuring the respective rows of the markings 24 of the pattern image formed by exposure on the recording medium 22.

A shift-amount registration section 142 is connected to the shift-amount calculating section 104. The shift-amount registration section 142 carries out registration of the obtained shift amount in the shift-amount calculating section 104. As a result, interpolation processing is carried out in the shift-amount calculating section 104 based on the registered shift amount, and a shift amount calculated from the zigzag curve is stored in the shift-amount storage memory 106.

In the exposure apparatus 10 of the second embodiment, displacement caused by zigzag movement is corrected in such a manner that the same exposure processing as that of the first embodiment is carried out based on the shift amount stored in the shift-amount storage memory 106. For this reason, it is not necessary to provide a CCD camera or the like used to detect zigzag movement.

Next, the operation of the second embodiment will be described.

Figure 16:
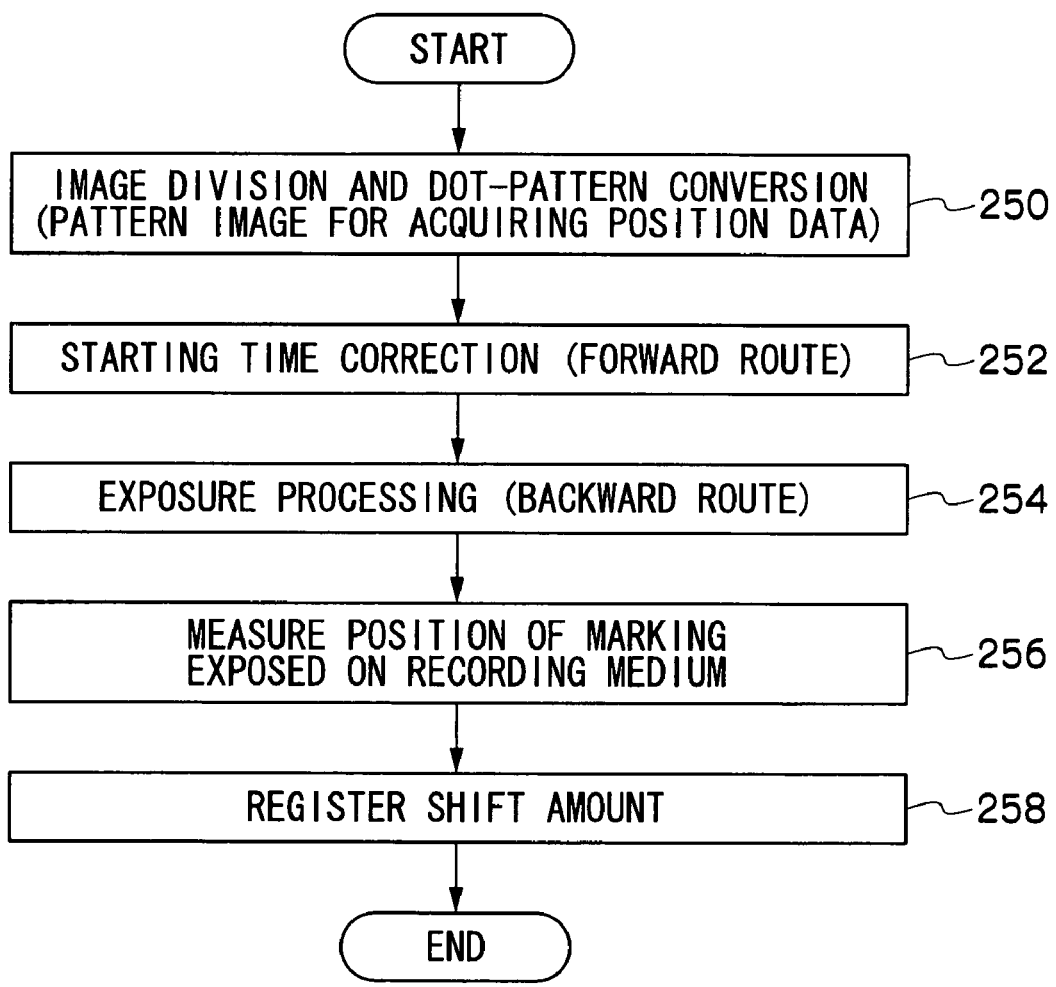
FIG. 16 is a flow chart concerning image-picking up processing, exposure of a pattern image for acquiring position data, and acquisition of a shift amount in accordance with the second embodiment.

FIG. 16 shows the flow regarding exposure of a pattern image for acquiring position data, and acquisition of a shift amount.

In step 250, when an instruction for exposure-formation of a pattern image for acquiring position data is given, the pattern image shown in FIG. 6D is divided into respective image data for the head assemblies 28A and converted to dot-pattern data, and the process proceeds to step 252. Incidentally, no image shift processing is carried out for the pattern image for acquiring position data.

In step 252, the exposure stage 16 is moved at a fixed speed in the forward direction (along the y-axis in FIG. 2 and from the front to the back of the apparatus), and the exposure starting timing is corrected by the alignment unit 32. When the exposure stage 16 arrives at the end of the forward route, the process proceeds to step 254.

In step 254, when the exposure stage 16 is moved at a fixed speed in the backward direction (along the y-axis in FIG. 2 and from the back to the front of the apparatus) and the corrected exposure starting timing comes, exposure processing of dot-pattern data is started and a pattern image is formed by exposure on the recording medium 22. Then, the process proceeds to step 256.

Figure 17A:
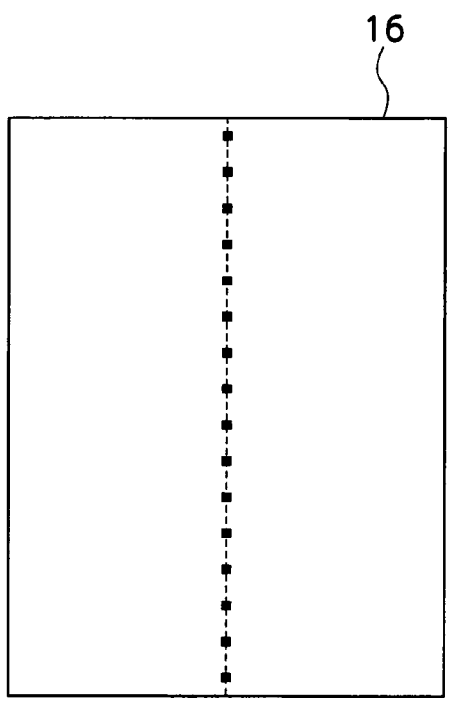
FIGS. 17A and 17B are diagrams each showing an exposed pattern for acquiring position data according to the second embodiment.
Figure 17B:
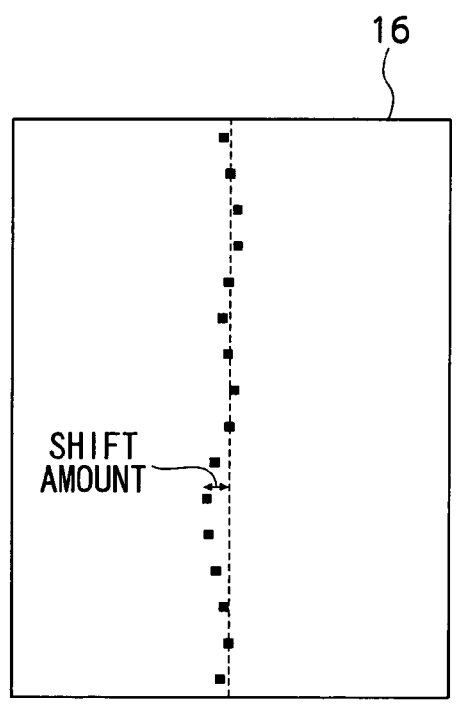

In step 256, each shift amount is obtained by measuring the positions of the markings 24 for each of the rows of the exposed pattern image, and the process proceeds to step 258. FIG. 17B shows an exposed pattern image (FIGS. 17A and 17B each show only one row of markings 24 among plural rows). The row of the markings 24 of the position-data-acquiring pattern (FIG. 17A) is arranged linearly, but displacement caused by zigzag movement occurs in the exposed pattern image. Therefore, the shift amount for each marking 24 can be measured.

In step 258, the shift amounts at the positions of the respective markings 24 in each row are registered, and interpolation processing is carried out based on the registered shift amounts, and the shift amounts calculated from the zigzag curve are stored in the shift-amount storage memory 106. Then, the process ends.

As a result, the shift amounts calculated from the respective zigzag curves in the rows of markings are stored in the shift-amount storage memory 106, and therefore, displacement caused by zigzag movement can be corrected in exposure processing.

In this manner, the second embodiment makes it possible to detect displacement caused by zigzag movement by exposing the marking 24 as a pattern image for acquiring position data. Further, it is possible to detect an amount of displacement for each row of markings by providing plural rows of the markings 24, and detect an amount of displacement at an arbitrary position on the exposure stage 16 by changing the positions of the rows of the markings 24 to be exposed (the positions in the direction indicated by arrow x), and further, detect an amount of displacement at the position of each head assembly 28A.

Third Embodiment

Next, a third embodiment of the present invention will be described. The third embodiment is characterized in that respective shift amounts of displacement in the moving direction and displacement in a direction intersecting the moving direction in relation to a stage surface of the exposure stage 16, which displacements are caused by pitching vibration occurring together with zigzag movement of the exposure stage 16, are detected, and based on the detected shift-amount data, an image represented by image data is corrected both in the moving direction and the intersecting direction.

In the exposure apparatus 10 according to the third embodiment, the markings 24 are arranged along the y-direction at predetermined intervals (in the third embodiment, at intervals of 50.0 mm), and other structures are the same as those shown in FIGS. 1 and 2 of the first embodiment, and therefore, a description thereof will be omitted.

Since the markings 24 are arranged at intervals of 50.0 mm in the exposure apparatus 10 according to the third embodiment, a timing at which the marking 24 is image-picked up by the CCD camera 34 is made into a timing of counting 500,000 pulses (50.0 mm/0.1 μm=500,000) from the linear encoder 27 each time.

Figure 18:
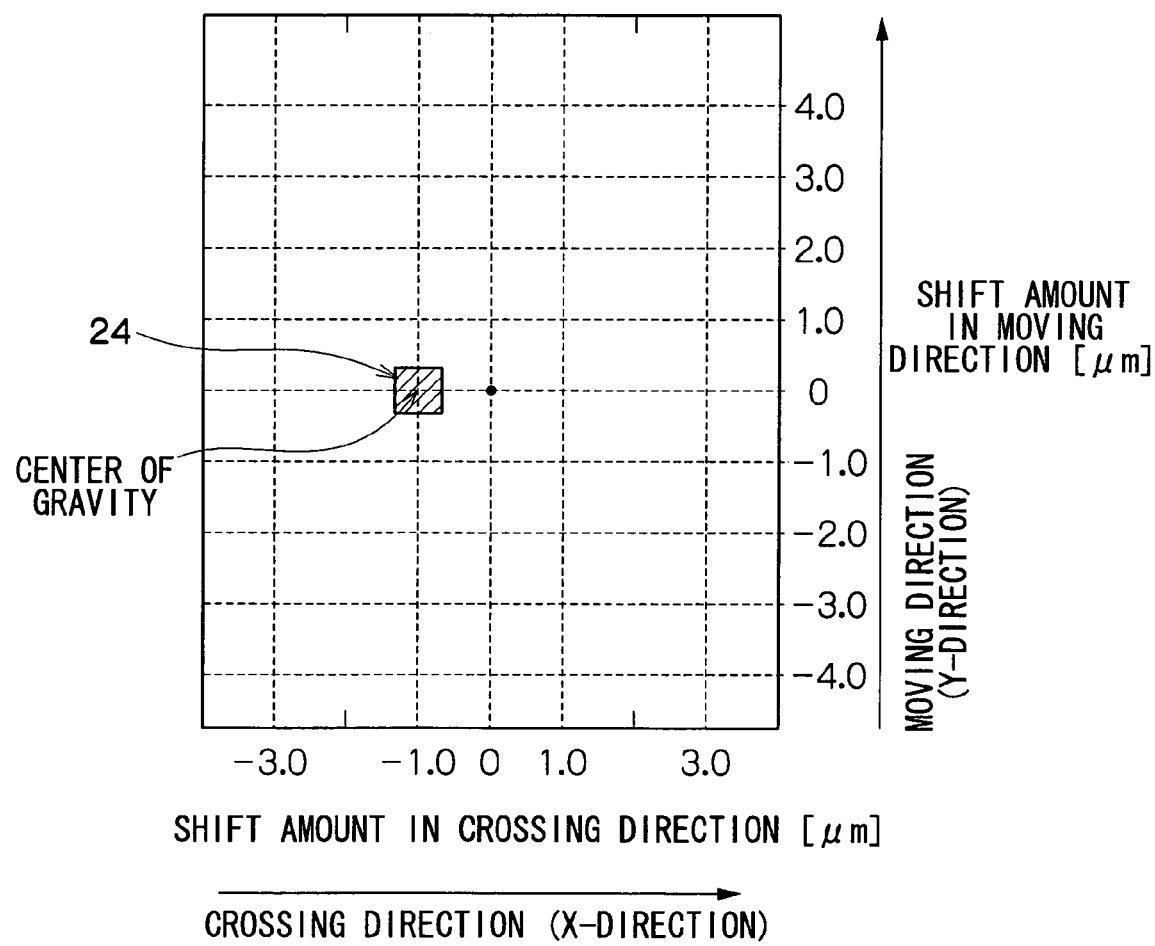
FIG. 18 is a diagram showing a marking image picked up by a CCD camera according to a third embodiment of the present invention.

Further, as shown in FIG. 18, in the marking image image-picked up by the CCD camera 34 according to the third embodiment, a reference that is used to determine the position in the moving direction (y-direction) and the position in the direction intersecting the moving direction (x-direction) with the center being the reference (0) is set, thereby making it possible to detect respective shift amounts from the position of the marking 24 within a marking image in the moving direction and the intersecting direction. In the following description, the shift amount in the moving direction is referred to as a moving-direction shift amount, and the shift amount in the intersecting direction is referred to as an intersecting-direction shift amount.

Figure 19:
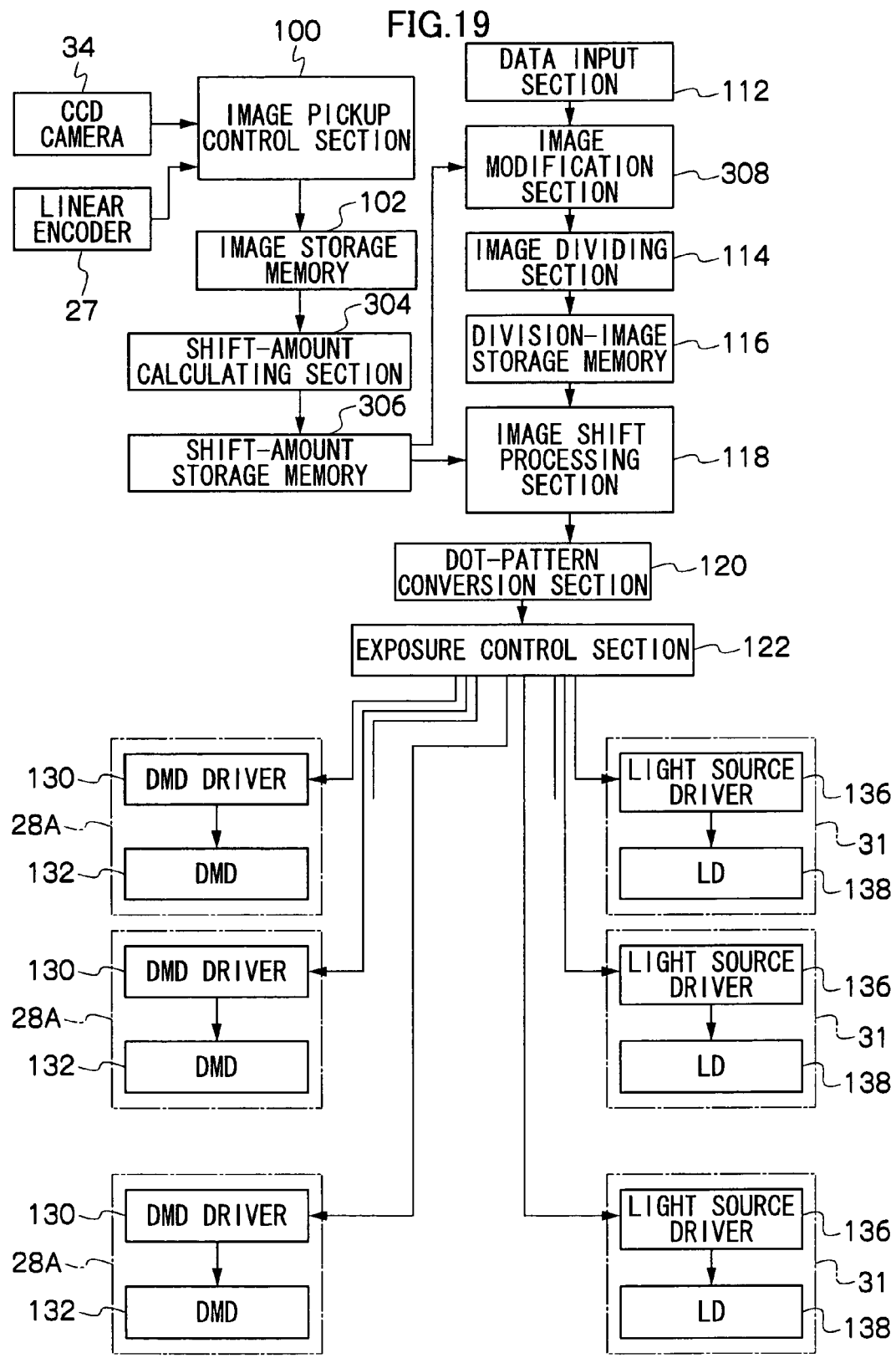
FIG. 19 is a functional block diagram for control in detecting displacement caused by zigzag movement of an exposure stage according to the third embodiment and in carrying out exposure.

FIG. 19 shows a functional block diagram of the third embodiment. Note that the portions denoted by the same reference numerals as those shown in FIG. 7 of the first embodiment will be the same, and therefore, a description thereof will be omitted and only different portions will be described below.

A shift-amount calculating section 304 is connected to the image storage memory 102 and a shift-amount storage memory 306. The shift-amount calculating section 304 reads respective marking images (see FIG. 18) stored in the image storage memory 102, obtains the position of the center of gravity as an identical relative position of the marking 24 in each marking image, and further, detects the intersecting-direction shift amount and moving-direction shift amount from the position of the center of gravity with respect to the reference (0) in each marking image.

Figure 20:
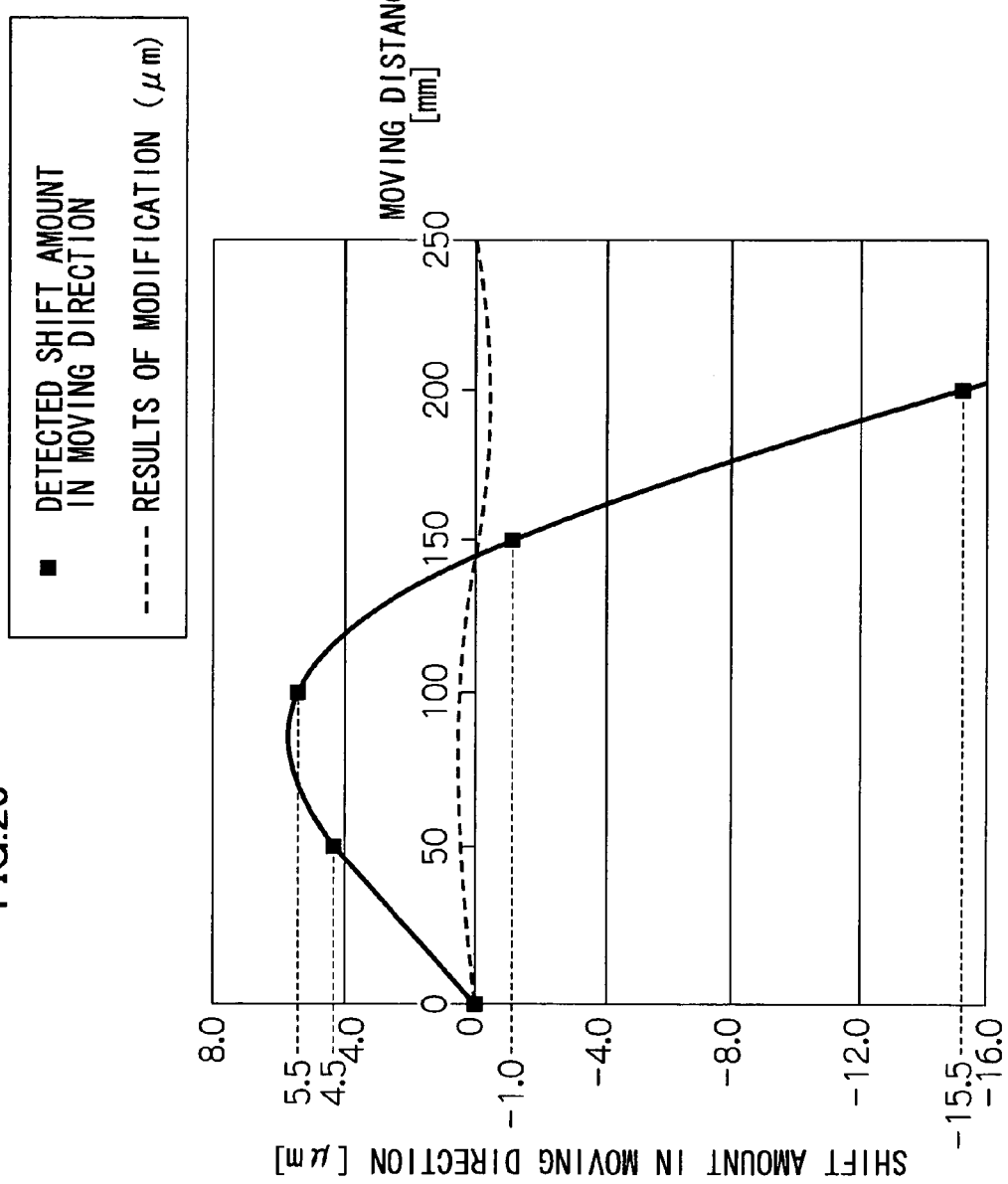
FIG. 20 is a diagram showing a shift amount in a moving direction accompanied by movement of the exposure stage according to the third embodiment.

The shift-amount calculating section 304 calculates, from each marking image, the moving-direction shift amount for each of intervals between the markings 24, and stores the same in the shift-amount storage memory 106. That is, the linear encoder 27 outputs one pulse each time movement of a distance of 0.1 μm, and therefore, when the exposure stage 16 moves a distance corresponding to 500,000 pulses, the movement comes to 50.0 mm (0.1 μm×500,000 pulses=50.0 mm). Therefore, the moving-direction shift amount detected from each marking image becomes constant if no displacement in the moving direction caused by pitching vibration occurs in the exposure stage 16. However, if the pitching vibration occurs in the exposure stage 16, the moving-direction shift amount detected from each marking image does not become constant, but varies as shown in FIG. 20. Accordingly, as shown in FIG. 21, the shift-amount calculating section 304 calculates the moving-direction shift amount generated at each of the intervals between the markings 24, and stores them in the shift-amount storage memory 106.

Further, the shift-amount calculating section 304 obtains, based on the detected intersecting-direction shift amount, a curve (a zigzag curve) of shift amounts due to zigzag movement that passes through respective intersecting-direction shift amounts (as indicated by the "x" marks) in the same manner as in the first embodiment shown in FIG. 8, and based on the zigzag curve, calculates the intersecting-direction shift amount at each of the positions in the moving direction (y-direction) between the markings 24 (at the midpoint (various points) of an interval of 50.0 mm), and stores the calculated shift amounts in the shift-amount storage memory 106.

The shift-amount storage memory 306 is connected to the shift-amount calculating section 304, the image shift processing section 118, and an image modification section 308. The shift-amount storage memory 306 stores the intersecting-direction shift amount obtained by the shift-amount calculating section 304 as shift-amount data in the intersecting direction, and stores the moving-direction shift amount as shift-amount data in the moving direction.

The image modification section 308 is connected to the data input section 112, the image dividing section 114, and the shift-amount storage memory 306. The image modification section 308 reads the moving-direction shift amount for each of the intervals between the markings 24 (see FIG. 21) from the shift-amount storage memory 306, and carries out modification, that is, deleting or adding a line or lines extending along the intersecting direction, from or to an image formed by image data that is inputted from the data input section 112. The number of lines to be deleted or added is determined in consideration of intervals of pixels arranged in the moving direction of the image formed by image data. For example, if the pixels are in units of 2 μm and the moving-direction shift amount is within the range of ±1.0 μm, no modification is carried out. However, the moving-direction shift amount is modified to become within the range of ±1.0 μm in such a manner that, if the moving-direction shift amount is greater than +1.0 μm, the required number of lines is deleted, and if the moving-direction shift amount is smaller than −1.0 μm, the required number of lines is added.

Figure 22A:
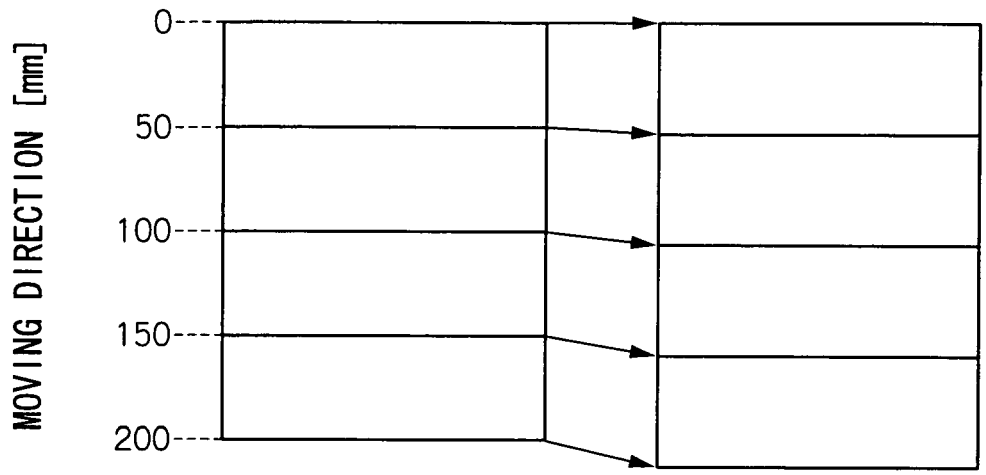
FIGS. 22A and 22B are conceptual diagrams each showing the result of image modification in which lines are deleted or added for an image to be formed by image data, in accordance with the third embodiment.
Figure 22B:
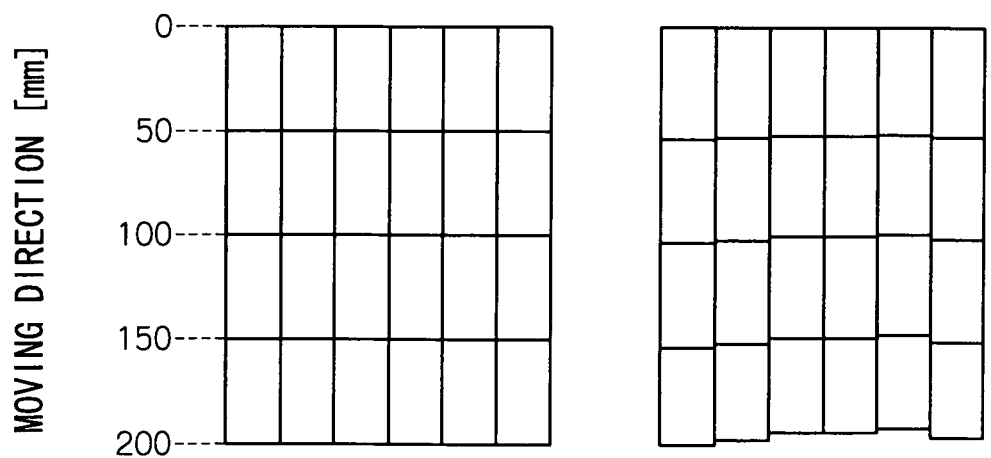

Incidentally, the position on the image formed by image data, at which a line or lines are deleted or added, is preferably set at uniform intervals depending on the number of lines to be deleted or added, within the range corresponding to the interval of the markings 24 in which the moving-direction shift amount is calculated. However, as long as the lines would fall within the aforementioned range, they may be deleted or added at any position. Further, each of pixels of a line or lines to be added is preferably obtained by correction processing or the like from pixels of lines adjacent to the position at which a line is to be added. However, the same pixels as those of any one of the lines adjacent to the position at which the line is to be added may also be added. Moreover, if only one row of markings 24 is provided, an entire region of an image formed by image data is modified based on the moving-direction shift amount in one row of markings, as shown in FIG. 22A. If plural rows of markings 24 are provided, it suffice that an image to be modified be divided into plural rectangular regions arranged along the moving direction corresponding to the positions of the rows of markings 24 in the x-direction and that a line or lines are deleted or added for each of the regions. In a case in which all of the moving-direction shift amounts are obtained by the rows of markings 24 being provided respectively at the positions of all the head assemblies 28A, it suffices that, as shown in FIG. 22B, the image is divided into regions corresponding to respective image data for the head assemblies 28A and a line or lines are deleted or added for each of the regions.

Next, the operation of the third embodiment will be described.

FIG. 23A shows a control flow concerning shift-amount calculation according to the third embodiment. Note that the same processing portions as those shown in FIG. 11A will be denoted by the same reference numerals, and a description thereof will be omitted.

In step 354, pulses from the linear encoder 27, which are generated by movement of the exposure stage 16, are detected, and the markings 24 placed at intervals of 50 mm are image-picked up by the CCD camera 34 each time 500,000 pulses are counted. If the backward movement is completed and all of the markings 24 forming one row is image-picked up, the process proceeds to step 356.

In step 356, the position of the center of gravity of the marking 24 is obtained from each of the image-picked up marking image, and the intersecting-direction shift amount and the moving-direction shift amount are detected from the position of the center of gravity in the marking image. Then, the process proceeds to step 358.

In step 358, the moving-direction shift amount generated at each of the intervals between the markings 24 is calculated from the moving-direction shift amount of each marking 24, as shown in FIG. 21, and the calculated shift amounts are stored in the shift-amount storage memory 106. Further, the zigzag curve is obtained by interpolation processing from the intersecting-direction shift amount of each marking 24, and the intersecting-direction shift amount at each of the positions in the moving direction, which is calculated from the zigzag curve, is stored in the shift-amount storage memory 106. Then, the process proceeds to end.

Subsequently, FIG. 23B shows a control flow concerning control of exposure processing according to the third embodiment. Note that the same processing portions as those shown in FIG. 11B will be denoted by the same reference numerals, and a description thereof will be omitted.

In step 400, the moving-direction shift amount generated at each of the intervals between the markings 24 is read from the shift-amount storage memory 306, and an image formed by input image data is modified in such a manner that a line or lines extending along the intersecting direction are deleted or added therefor. Thereafter, the process proceeds to step 401.

For example, in the case in which, as shown in FIG. 21, the moving-direction shift amount at an interval of 0 to 50 mm is 4.5 μm, when an image based on image data is formed on a recording medium on the exposure stage 16, a pixel at the position of 50 mm in the image based on image data is recorded at the position of 50.0045 mm on the recording medium, and a pixel to be recorded on the recording medium at the position of 50 mm corresponding to a pixel at the position of 49.9955 mm ((50 mm)$^2$/50.0045 mm=49.9955 mm) in the image based on image data. Accordingly, the image modification section 308 carried out modification so as to delete two lines from the range of 0 to 50 mm in the image formed by image data. As a result, the range of 0 to 50 mm in the image formed by image data becomes narrow by 4.0 μm (2×2.0 μm=4.0 μm), and therefore, the pixel at the position of 50 mm is recorded at the position of 50.0005 mm on the recording medium. Thus, by carrying out modification so as to delete or add a line or lines in each of the regions corresponding to the intervals of the markings 24, displacement in the moving direction is corrected as shown in the result of modification in FIG. 20.

In step 401, the modified image data is divided into respective image data for head assemblies of the exposure head unit 28, and is stored in the division-image storage memory 116. Thereafter, the process proceeds to step 202.

As described above, in the third embodiment, displacements in the direction in which the exposure stage 16 moves and displacement in the direction intersecting the moving direction, with respect to a stage surface, accompanied by movement of the exposure stage 16, are detected; the moving-direction shift amount and the intersecting-direction shift amount are stored; and based on the stored moving-direction shift amount, displacement in the moving direction is corrected by carrying out modification so as to delete or add a line or lines extending along the intersecting direction, from or to an image formed by image data; based on the intersecting-direction shift amount, each of pixels of the modified image is shifted in the intersecting direction and displacement of the recording stage in the intersecting direction is corrected; and based on the image data of the corrected image, exposure for the recording medium is controlled. Therefore, distortion of an image to be depicted on the recording medium can be reduced and a fine-grained image can be formed.

Further, the exposure apparatus 10 according to the third embodiment allows detection of the intersecting-direction shift amount and the moving-direction shift amount at an arbitrary position along the rail 35 by moving the CCD camera 34 (see FIG. 1) along the rail 35. For this reason, by detecting the intersecting-direction shift amount and moving-direction shift amount at each of many positions, carrying out modification so as to delete or add a line or lines for each of plural regions into which an image formed by image data is divided, and carrying out image shift processing, displacement of the exposure stage 16 can also be corrected even when horizontally-rotating displacement of the exposure stage 16 occurs accompanied by movement of the exposure stage 16.

Figure 24:
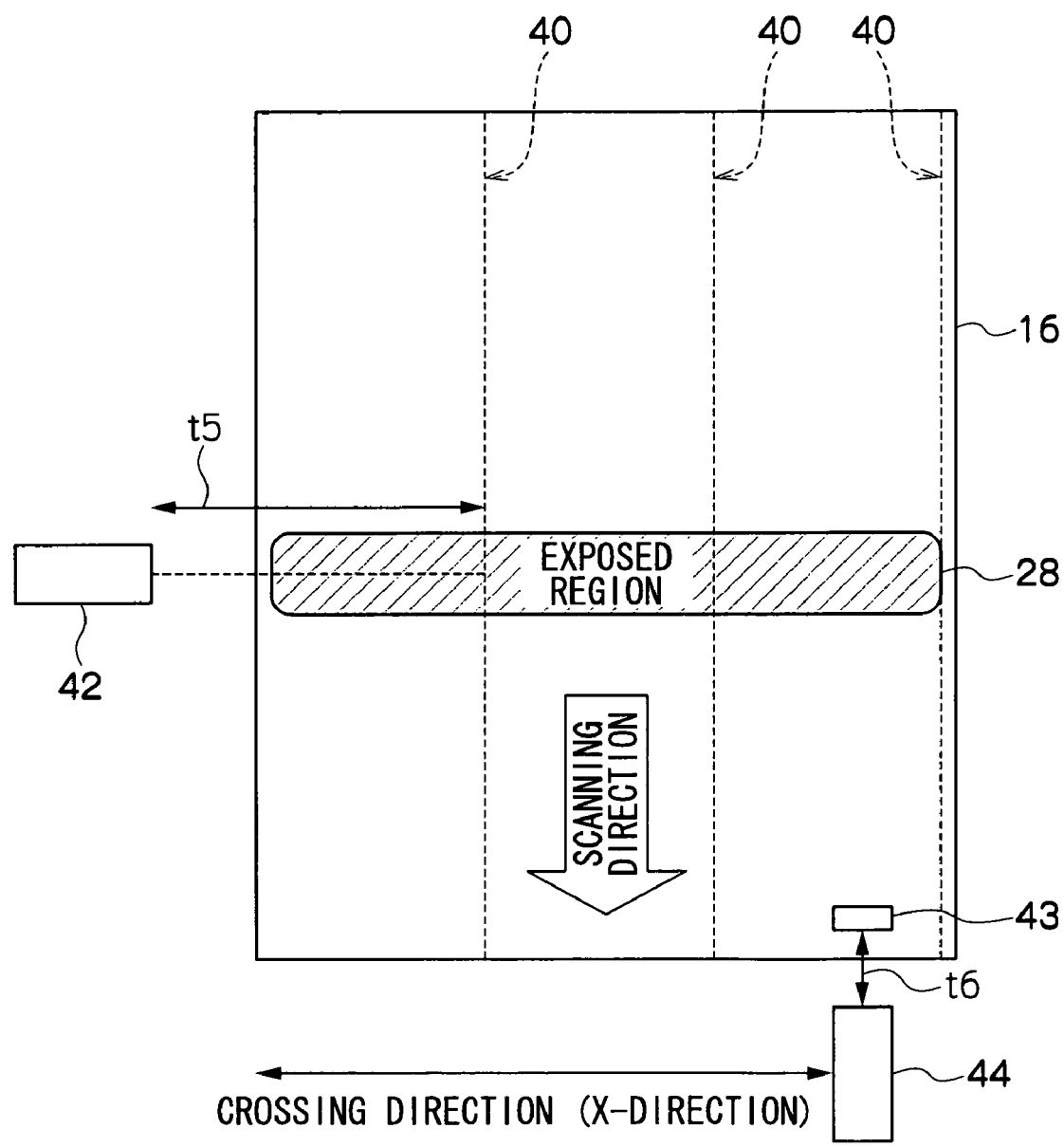
FIG. 24 is a diagram showing an example of the structure in which displacement of the exposure stage in each of moving and crossing directions is detected using a laser length-measuring machine.

Incidentally, although in the third embodiment, the intersecting-direction shift amount and the moving-direction shift amount are detected by image-picking up the markings 24 on the exposure stage 16, it is possible that, in addition to the laser length-measuring machine 42 in the first embodiment, as shown in FIG. 24, a length-measuring portion 43 is provided in a direction perpendicular to the moving direction of the exposure stage 16, and a distance to the length-measuring portion 43 of the exposure stage 16 (distance t6 in FIG. 24) is measured using the laser length-measuring machine 44 at each image-picking up timing, and based on intervals in which the distance varies at each image-picking up timing, the moving-direction shift amount caused by the pitching vibration of the exposure stage 16 may also be detected. In the third embodiment, the moving-direction shift amount can be detected by connecting the laser length-measuring machine 44 further to the shift-amount calculating section 104 (see FIG. 7) and by comparing the interval in which the distance to the length-measuring portion 43 of the exposure stage 16, which is measured by a displacement detecting section 104 at each image-picking up timing, varies, to 50 mm (the exposure stage 16 moves 50 mm (=500,000 pulses×0.1 μm) at each image-picking up timing). Further, if plural length-measuring portions 43 are provided on the exposure stage 16, and a rail and a motor, or the like are provided so as to move the laser length-measuring machine 44 in the x-direction in FIG. 24, the moving-direction shift amounts at plural positions can also be detected. In this way, if the moving-direction shift amount is detected using the laser length-measuring machine 44, there is no need of making the markings 24 on the exposure stage 16.

Further, in the third embodiment, the shift-amount storage memory 306 is adapted to store therein the calculated moving-direction shift amount generated at each of the intervals between the markings 24 as shown in FIG. 21. However, the shift-amount storage memory 306 may also store therein the moving-direction shift amount of each marking 24 as shown in FIG. 20. In this case, it suffices that the image modification section 308 is provided so as to calculate the moving-direction shift amount generated at each of intervals between the markings 24 and carry out modification so as to delete or add a line or lines.

Moreover, the exposure apparatus 10 according to the third embodiment is, as in the second embodiment, structured in such a manner that the pattern input section 140 and the shift-amount registration section 142 are provided, each of the rows of markings 24 of a pattern image formed by exposure on the recording medium 22 is measured by an operator or the like, thus obtaining the moving-direction shift amount and the intersecting-direction shift amount, and the shift-amount registration section 142 carries out registration of these shift amounts.

Furthermore, in the aforementioned first to third embodiments, an example has been described in which a correction method for correcting an error of the position at which an image is recorded on a recording medium, which error occurs due to conveying error of a recording stage, is applied to an exposure apparatus. However, this correction method is also applicable to various plotting apparatuses (methods) such as an ink jet type apparatus. That is, the present invention can be structured as a method and apparatus in which an image is recorded on a recording medium using image data corrected in accordance with conveying error of a recording stage.

As described above, the present invention has an excellent effect that displacement of a recording stage, which is caused by zigzag movement of a recording state, is detected at each of positions of recording heads, and based on shift-amount data of the detected displacement, displacement of the recording stage caused by zigzag movement can be corrected by shifting an image, thereby making it possible to reduce distortion of an image to be drawn on the recording medium.

What is claimed is:

1. An exposure method in which an image is formed on a recording medium mounted on a recording stage by irradiating light beams based on image data from plural recording heads arranged linearly while the recording heads and the recording stage are relatively moved in a direction intersecting a direction in which the recording heads are arranged, to allow the image to be formed by exposure on the recording medium, the method comprising:

storing in advance, in a storage section, shift-amount data of a detected displacement of an image-form position with respect to a stage surface of the recording stage in a direction intersecting a direction in which the recording stage moves, which displacement occurs accompanied by movement of the recording stage;

dividing an image formed by the image data into separate images which are respectively formed by the plurality of recording heads;

carrying out shifting for each of pixels of the separate images based on the shift-amount data stored in the storage section;

carrying out trimming the shifted separate images at positions at which the shifted separate images are connected; and controlling exposure for the recording medium by the recording heads based on respective image data of the separate images subjected to the trimming.

2. The exposure method according to claim 1, wherein the image formed by the image data is divided into images which can be exposed by the respective recording heads, and thereafter, to each image into which the image formed by the image data is divided, an image region of the adjacent image into which the image formed by the image data is divided is added, the image region having at least a width of a shift amount based on the shift-amount data which is stored.

3. The exposure method according to claim 1, wherein the image formed by the image data is divided into images which can be exposed by the respective recording heads, such that to each image into which the image formed by the image data is divided, an image region of an adjacent image into which the image formed by the image data is divided is added, the image region having at least a width of a shift amount based on the shift-amount data stored in the storage section.

4. The exposure method according to claim 1, wherein one row or plural rows of markings are arranged on the recording stage at fixed intervals along a direction in which the recording head and the recording stage are moved, and wherein the detecting of the displacement is carried out by:

moving an image-picking up section in the direction intersecting the moving direction of the recording stage to allow image-picking up of each row of markings at each predetermined timing;

detecting an identical relative position of each of the markings from the marking image which is image-picked up; and detecting, based on a position, in the marking image, of the detected identical relative position of each of the markings, displacement in the intersecting direction.

5. The exposure method according to claim 4, wherein the markings are provided on the recording stage by mounting a marking chart on which markings are formed on the recording stage.

6. The exposure method according to claim 1, wherein one or plural length-measuring portions are provided on the recording stage, and wherein the detecting of the displacement is carried out by:

measuring a distance to the length-measuring portion of the recording stage at each predetermined timing by a laser length-measuring machine that is disposed in a direction intersecting a direction in which the recording head and the recording stage relatively move with respect to the stage surface of the recording stage; and detecting, based on variations in the measured distance to the length-measuring portion of the recording stage, displacement in the intersecting direction.

7. The exposure method according to claim 1, wherein the detecting of the displacement is carried out by:

forming by exposure a predetermined position-data-acquiring pattern on the recording medium; and registering the shift-amount data obtained from the position-data-acquiring pattern which is formed by exposure.

8. The exposure method according to claim 1, wherein the displacement at each of positions corresponding to all the recording heads is detected.

9. The exposure method according to claim 1, wherein the dividing the image comprises dividing the image to be formed by the image data into separate images.

10. An exposure method in which an image is formed on a recording medium mounted on a recording stage by irradiating light beams based on image data from plural recording heads arranged linearly while the recording heads and the recording stage are relatively moved in a direction intersecting a direction in which the recording heads are arranged, to allow the image to be formed by exposure on the recording medium, the method comprising: storing in advance, in a storage section, shift-amount data in a moving direction in which the recording stage moves and shift-amount data in an intersecting direction intersecting the moving direction, of a detected displacement of an image-form position with respect to a stage surface of the recording stage, which displacement occurs accompanied by movement of the recording stage; carrying out modification so as to delete or add a line or lines extending along the intersecting direction, from or to an image formed by the image data based on the shift-amount data in the moving direction stored in the storage section; dividing the modified image into separate images which are respectively formed by the plurality of recording heads; carrying out shifting for each of pixels of the separate images based on the shift-amount data in the intersecting direction which is stored in the storage section; trimming the shifted separate images at positions at which the shifted separate images are connected; and controlling exposure for the recording medium by the recording heads based on respective image data of the separate images subjected to the trimming.

11. The exposure method according to claim 10, wherein the modified image is divided into images which can be exposed by the respective recording heads, and thereafter, to each image into which the modified image is divided, an image region of the adjacent image into which the modified image is divided is added, the image region having at least a width of a shift amount based on the shift-amount data which is stored.

12. The exposure method according to claim 10, wherein the modified image is divided into images which can be exposed by the respective recording heads, such that, to each image into which the modified image is divided, an image region of an adjacent image into which the modified image is divided is added, the image region having at least a width of a shift amount based on the shift-amount data which is stored.

13. The exposure method according to claim 10, wherein the displacement at each of positions corresponding to all the recording heads is detected.

14. An exposure apparatus in which an image is formed on a recording medium mounted on a recording stage by irradiating light beams based on image data from plural recording heads arranged linearly while the recording heads and the recording stage are relatively moved in a direction intersecting a direction in which the recording heads are arranged, to allow the image to be formed by exposure on the recording medium, the apparatus comprising: a displacement detecting section that detects displacement of an image-form position with respect to a stage surface of the recording stage in a direction intersecting a direction in which the recording stage moves, which displacement occurs accompanied by movement of the recording stage; a storage section that stores therein shift-amount data of the displacement detected by the displacement detecting section; a dividing section that divides an image formed by the image data into separate images to be respectively formed by the plural recording heads; a shift section that, based on the shift-amount data stored in the storage section, shifts respective pixels of each of the separate images obtained by the dividing section; a trimming section that trims the separate images shifted by the shift section at positions at which the separate images are connected; and an exposure control section that, based on respective image data of the separate images subjected to trimming by the trimming section, controls exposure for the recording medium by the recording heads.

15. The exposure apparatus according to claim 14, wherein the dividing section divides the image formed by the image data into images which can be exposed by the respective recording heads, and thereafter, to each image into which the image formed by the image data is divided by the dividing section, an image region of the adjacent image into which the image formed by the image data is divided by the dividing section is added, the image region having at least a width of a shift amount based on the shift-amount data stored in the storage section.

16. The exposure apparatus according to claim 14, wherein the dividing section divides the image formed by the image data into images which can be exposed by the respective recording heads, such that to each image into which the image formed by the image data is divided by the dividing section, an image region of an adjacent image into which the image formed by the image data is divided by the dividing section is added, the image region having at least a width of a shift amount based on the shift-amount data stored in the storage section.

17. The exposure apparatus according to claim 14, wherein one row or plural rows of markings are arranged on the recording stage at fixed intervals along a direction in which the recording head and the recording stage are moved, and wherein the displacement detecting section comprises:
at least one image-picking up section that image-picks up the markings of the row on the recording stage at each predetermined timing;
a moving section that moves the image-picking up section in the direction intersecting the moving direction of the recording stage, thereby allowing image-picking up of each row of markings;
an identical relative position detecting section that detects an identical relative position of each of the markings from the marking image image-picked up by the image-picking up section; and
a first detecting section that, based on a position, in the marking image, of the identical relative position of each of the markings detected by the identical relative position detecting section, detects displacement in the intersecting direction.

18. The exposure apparatus according to claim 17, wherein the markings are provided on the recording stage by mounting a marking chart on which markings are formed on the recording stage.

19. The exposure apparatus according to claim 14, wherein one or plural length-measuring portions are provided on the recording stage, and wherein the displacement detecting section comprises: a laser length-measuring machine that is disposed in a direction intersecting a direction in which the recording head and the recording stage relatively move with respect to the stage surface of the recording stage, and measures a distance to the length-measuring portion of the recording stage at each predetermined timing; and a second detecting section that, based on variations in the distance to the length-measuring portion of the recording stage, which distance is measured by the laser length-measuring machine, detects displacement in the intersecting direction.

20. The exposure apparatus according to claim 14, wherein the displacement detecting section comprises: a position pattern exposure section that forms by exposure a predetermined position-data-acquiring pattern on the recording medium; and a registration section that registers, in the storage section, the shift-amount data obtained from the position-data-acquiring pattern formed by exposure by the position pattern exposure section.

21. The exposure apparatus according to claim 14, wherein the displacement detecting section detects the displacement at each of positions corresponding to all the recording heads.

22. An exposure apparatus in which an image is formed on a recording medium mounted on a recording stage by irradiating light beams based on image data from plural recording heads arranged linearly while the recording heads and the recording stage are relatively moved in a direction intersecting a direction in which the recording heads are arranged, to allow the image to be formed by exposure on the recording medium, the apparatus comprising: a displacement detecting section that detects displacement of an image-form position with respect to a stage surface of the recording stage in a moving direction in which the recording stage moves and in an intersecting direction intersecting the moving direction, which displacement occurs accompanied by movement of the recording stage; a storage section that stores therein shift-amount data of displacement in the moving direction, and shift-amount data of displacement in the intersecting direction, which displacement is both detected by the displacement detecting section; a modification section that carries out modification so as to delete or add a line or lines extending along the intersecting direction, from or to an image formed by the image data based on the shift-amount data in the moving direction which is stored in the storage section; a dividing section that divides the image modified by the modification section into separate images to be respectively formed by the plural recording heads; a shift section that shifts respective pixels of the separate images, into which the image is divided by the dividing section, based on the shift-amount data in the intersecting direction which is stored in the storage section; a trimming section that trims the separate images shifted by the shift section at positions at which the separate images are connected; and an exposure control section that, based on respective image data of the separate images subjected to trimming by the trimming section, controls exposure for the recording medium by the recording heads.

23. The exposure apparatus according to claim 22, wherein the dividing section divides the image modified by the modification section into images which can be exposed by the respective recording heads, and thereafter, to each image into which the modified image is divided by the dividing section, an image region of the adjacent image into which the modified image is divided by the dividing section is added, the image region having at least a width of a shift amount based on the shift-amount data stored in the storage section.

24. The exposure apparatus according to claim 22, wherein the dividing section divides the image modified by the modification section into images which can be exposed by the respective recording heads, such that, to each image into which the modified image is divided by the dividing section, an image region of an adjacent image into which the modified image is divided by the dividing section is added, the image region having at least a width of a shift amount based on the shift-amount data stored in the storage section.

25. The exposure apparatus according to claim 22, wherein one row or plural rows of markings are arranged on the recording stage at fixed intervals along a direction in which the recording head and the recording stage are moved, and wherein the displacement detecting section comprises:

at least one image-picking up section that image-picks up the markings on the row on the recording stage at each predetermined timing; a moving section that moves the image-picking up section in the direction intersecting the direction in which the recording head and the recording stage relatively move, thereby allowing image-picking up of each row of markings; an identical relative position detecting section that detects an identical relative position of each of the markings from the marking image image-picked up by the image-picking up section; and a first detecting section that, based on a position, in the marking image, of the identical relative position of each of the markings detected by the identical relative position detecting section, detects displacement in the intersecting direction and in the moving direction of the recording stage.

26. The exposure apparatus according to claim 25, wherein the markings are provided on the recording stage by mounting a marking chart on which markings are formed on the recording stage.

27. The exposure apparatus according to claim 22, wherein one or plural length-measuring portions are provided on the recording stage, and wherein the displacement detecting section comprises: a first laser length-measuring machine that is disposed in the intersecting direction with respect to the stage surface of the recording stage, and measures a distance to the length-measuring portion of the recording stage at each predetermined timing; a second detecting section that, based on variations in the distance to the length-measuring portion of the recording stage, which distance is measured by the first laser length-measuring machine, detects displacement in the intersecting direction, a second laser length-measuring machine that is disposed in the moving direction with respect to the recording stage and that measures a distance to the recording stage at each predetermined timing; a second moving section that moves the second laser length-measuring machine in the intersecting direction in a range in which the distance to the recording stage can be measured; and a third detecting section that, based on intervals in which the distance to the recording stage measured by the second laser length-measuring machine varies at each predetermined timing, detects displacement of the recording stage in the moving direction thereof.

28. The exposure apparatus according to claim 22, wherein the displacement detecting section comprises: a position pattern exposure section that forms by exposure a predetermined position-data-acquiring pattern on the recording medium; and a registration section that registers, in the storage section, the shift-amount data of the displacement in the moving direction and the shift-amount data of the displacement in the intersecting direction obtained from the position-data-acquiring pattern formed by exposure by the position pattern exposure section.

29. The exposure apparatus according to claim 22, wherein the displacement detecting section detects the displacement at each of positions corresponding to all the recording heads.

* * * * *